US012777817B2

(12) United States Patent
Kim et al.

(10) Patent No.: US 12,777,817 B2
(45) Date of Patent: Oct. 27, 2026

(54) DISPLAY PANEL PAD CONFIGURATION AND ELECTRONIC DEVICE INCLUDING THE SAME

(71) Applicant: Samsung Display Co., Ltd., Yongin-si (KR)

(72) Inventors: Kyongjun Kim, Yongin-si (KR); Seojin Kim, Yongin-si (KR); Heejin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 527 days.

(21) Appl. No.: 18/348,219

(22) Filed: Jul. 6, 2023

(65) Prior Publication Data

US 2024/0049572 A1 Feb. 8, 2024

(30) Foreign Application Priority Data

Aug. 8, 2022 (KR) ........................ 10-2022-0098837

(51) Int. Cl.
*H10K 59/80* (2023.01)
*H10K 59/123* (2023.01)
*H10K 59/131* (2023.01)
*H10K 59/40* (2023.01)

(52) U.S. Cl.
CPC ......... *H10K 59/873* (2023.02); *H10K 59/123* (2023.02); *H10K 59/131* (2023.02); *H10K 59/40* (2023.02)

(58) Field of Classification Search
CPC .... H10K 59/873; H10K 59/131; H10K 59/40; H10K 59/123
USPC .......................... 257/40, 59, 88, 91, 99, 100
See application file for complete search history.

(56) References Cited

U.S. PATENT DOCUMENTS 7,999,258 B2 * 8/2011 Lee ....................... G02F 1/1368 257/268
9,219,244 B2 * 12/2015 Lee ...................... H10D 86/441
9,437,665 B2 9/2016 Yoon
10,756,034 B2 8/2020 Huang et al.
2009/0020758 A1 * 1/2009 Lee ....................... G02F 1/1368 438/158

(Continued)

FOREIGN PATENT DOCUMENTS

CN 109273483 A 1/2019
EP 3770965 A2 1/2021

(Continued)

*Primary Examiner* — Eric W Jones
(74) *Attorney, Agent, or Firm* — Womble Bond Dickinson (US) LLP

(57) ABSTRACT

A display panel includes: a substrate including a display area, a non-display area outside the display area, and a pad area in the non-display area; a display portion in the display area and including a subpixel; and a pad portion in the pad area and including a pad, wherein the pad comprises: a first conductive layer on the substrate; a first inorganic insulating layer covering the first conductive layer and including a first contact hole exposing at least a part of the first conductive layer; a second conductive layer on the first inorganic insulating layer and in contact with the first conductive layer through the first contact hole; and a third conductive layer covering the second conductive layer, and an edge of the third conductive layer is covered with at least one transparent conductive material layer.

23 Claims, 11 Drawing Sheets

(56) References Cited

U.S. PATENT DOCUMENTS

| | | | | |
|---|---|---|---|---|
| 2014/0042394 | A1* | 2/2014 | Lee | H10D 86/441 438/34 |
| 2014/0362304 | A1* | 12/2014 | Wang | G06F 3/0412 349/12 |
| 2016/0020422 | A1* | 1/2016 | Kim | H10K 59/80522 257/40 |
| 2016/0197132 | A1* | 7/2016 | Cho | H01L 23/5225 257/40 |
| 2019/0131379 | A1 | 5/2019 | Won et al. | |
| 2021/0028241 | A1* | 1/2021 | Kim | H10D 86/60 |
| 2021/0043712 | A1 | 2/2021 | Kim et al. | |
| 2022/0059633 | A1 | 2/2022 | Kang et al. | |
| 2022/0069023 | A1* | 3/2022 | Lou | H10K 59/122 |
| 2022/0130930 | A1 | 4/2022 | Yang et al. | |
| 2022/0246687 | A1 | 8/2022 | Lee et al. | |

FOREIGN PATENT DOCUMENTS

| | | | |
|---|---|---|---|
| EP | 3902003 | A2 | 10/2021 |
| KR | 0145895 | B1 | 8/1996 |
| KR | 10-2015-0025261 | A | 3/2015 |
| KR | 10-2016-0014259 | A | 2/2016 |
| KR | 10-2021-0011529 | A | 2/2021 |
| KR | 10-2022-0026002 | A | 3/2022 |
| KR | 10-2022-0065974 | A | 5/2022 |
| KR | 10-2022-0110396 | A | 8/2022 |

* cited by examiner

DISPLAY PANEL PAD CONFIGURATION AND ELECTRONIC DEVICE INCLUDING THE SAME

CROSS-REFERENCE TO RELATED APPLICATION

The present application claims priority to and the benefit of Korean Patent Application No. 10-2022-0098837, filed on Aug. 8, 2022, in the Korean Intellectual Property Office, the entire disclosure of which is incorporated herein by reference.

BACKGROUND

1. Field

Aspects of one or more embodiments relate to a display panel and an electronic device including the same.

2. Description of the Related Art

Display panels are devices capable of visually displaying data. Recently, display panels have been used for various purposes. Also, as display panels have become thinner and lighter, their range of use has widened.

A display panel may be divided into a display area and an outer non-display area. A plurality of subpixels may be arranged in the display area, and each of the subpixels may include an organic light-emitting diode and a subpixel circuit electrically connected to the organic light-emitting diode. The non-display area may include various wires transmitting electrical signals to the display area, a scan driver, a data driver, a controller, etc.

A pad area, in which a plurality of pads respectively connected to ends of the wires to transmit electrical signals to the display area are arranged, may be located at one side of the non-display area.

The above information disclosed in this Background section is only for enhancement of understanding of the background and therefore the information discussed in this Background section does not necessarily constitute prior art.

SUMMARY

Aspects of one or more embodiments include a display panel with relatively improved reliability and an electronic device including the same. However, these problems are merely examples and the scope of the disclosure is not limited thereto.

Additional aspects will be set forth in part in the description that follows and, in part, will be apparent from the description, or may be learned by practice of the embodiments of the disclosure.

According to one or more embodiments, a display panel includes a substrate including a display area, a non-display area outside the display area, and a pad area located in the non-display area, a display portion arranged in the display area and including a subpixel, and a pad portion arranged in the pad area and including a pad, wherein the pad includes a first conductive layer arranged on the substrate, a first inorganic insulating layer covering the first conductive layer and including a first contact hole exposing at least a part of the first conductive layer, a second conductive layer arranged on the first inorganic insulating layer and in contact with the first conductive layer through the first contact hole, and a third conductive layer covering the second conductive layer, and an edge of the third conductive layer is covered with at least one transparent conductive material layer.

According to some embodiments, the display panel may further include a second inorganic insulating layer covering the at least one transparent conductive material layer and including a second contact hole exposing at least a part of the third conductive layer, and a fourth conductive layer arranged on the second inorganic insulating layer and in contact with the third conductive layer through the second contact hole.

According to some embodiments, the third conductive layer may have a triple-layer structure including a first layer, a third layer, and a second layer arranged between the first layer and the third layer, which include a same material.

According to some embodiments, the first layer and the third layer of the third conductive layer may include titanium, and the second layer of the third conductive layer may include aluminum.

According to some embodiments, the display area may include a first display area and a second display area at least partially surrounded by the first display area, the display panel may include a plurality of first display devices arranged in the first display area, a plurality of second display devices arranged in the second display area, a plurality of second subpixel circuits respectively and electrically connected with the plurality of second display devices, and a plurality of connection wires respectively and electrically connecting the plurality of second display devices with the plurality of second subpixel circuits, and the plurality of second subpixel circuits are placed between the first display area and the second display area or in the non-display area.

According to some embodiments, the plurality of connection wires may include a first connection wire and a second connection wire arranged on the first connection wire.

According to some embodiments, the at least one transparent conductive material layer may include a same material as the first connection wire.

According to some embodiments, the at least one transparent conductive material layer may include a first transparent conductive material layer and a second transparent conductive material layer arranged on the first transparent conductive material layer.

According to some embodiments, the first transparent conductive material layer may include a same material as the first connection wire, and the second transparent conductive material layer may include a same material as the second connection wire.

According to some embodiments, the at least one transparent conductive material layer may sequentially cover a top surface of the third conductive layer, a side surface corresponding to the edge of the third conductive layer, and a top surface of the first inorganic insulating layer arranged under the third conductive layer.

According to some embodiments, the at least one transparent conductive material layer may be in direct contact with the top surface of the third conductive layer, the side surface corresponding to the edge of the third conductive layer, and the top surface of the first inorganic insulating layer arranged under the third conductive layer.

According to some embodiments, the display panel may further include a display device arranged in the display area, a thin film transistor arranged between the substrate and the display device, and a connection electrode electrically connecting the display device with the thin film transistor, the thin film transistor may include a semiconductor layer, a gate electrode at least partially overlapping with the semiconductor layer, and an electrode layer arranged on the gate electrode and electrically connected with the semiconductor layer, and the third conductive layer may include a same material as the connection electrode.

According to some embodiments, the first conductive layer may include a same material as the gate electrode, and the second conductive layer may include a same material as the electrode layer.

According to some embodiments, the display panel may further include a thin film encapsulation layer arranged on the display portion and including at least one organic encapsulation layer and at least one inorganic encapsulation layer, and a touch sensor layer arranged on the thin film encapsulation layer, the touch sensor layer may include a first touch insulating layer, a first touch electrode layer arranged on the first touch insulating layer, a second touch insulating layer arranged on the first touch electrode layer, and a second touch electrode layer arranged on the second touch insulating layer, and the fourth conductive layer may include a same material as the second touch electrode layer.

According to one or more embodiments, an electronic device includes a display panel including a display area including a first display area and a second display area at least partially surrounded by the first display area, a non-display area outside the display area, and a pad area located in the non-display area, and a component arranged under the display panel and in correspondence with the second display area, wherein the display panel includes a substrate, a display portion arranged in the display area and including a subpixel, and a pad portion arranged in the pad area and including a pad, the pad includes a first conductive layer arranged on the substrate, a first inorganic insulating layer covering the first conductive layer and including a first contact hole exposing at least a part of the first conductive layer, a second conductive layer arranged on the first inorganic insulating layer and in contact with the first conductive layer through the first contact hole, and a third conductive layer covering the second conductive layer, and an edge of the third conductive layer is covered with at least one transparent conductive material layer.

According to some embodiments, the display panel may further include a second inorganic insulating layer covering the at least one transparent conductive material layer and including a second contact hole exposing at least a part of the third conductive layer, and a fourth conductive layer arranged on the second inorganic insulating layer and in contact with the third conductive layer through the second contact hole.

According to some embodiments, the display panel may include a plurality of first display devices arranged in the first display area, a plurality of second display devices arranged in the second display area, and a plurality of connection wires respectively connecting a plurality of second subpixel circuits to the plurality of second display devices, and the plurality of second subpixel circuits may be placed between the first display area and the second display area or in the non-display area.

According to some embodiments, the plurality of connection wires may include a first connection wire and a second connection wire arranged on the first connection wire.

According to some embodiments, the at least one transparent conductive material layer may include a same material as the first connection wire.

According to some embodiments, the at least one transparent conductive material layer may include a first transparent conductive material layer and a second transparent conductive material layer arranged on the first transparent conductive material layer.

According to some embodiments, the first transparent conductive material layer may include a same material as the first connection wire, and the second transparent conductive material layer may include a same material as the second connection wire.

According to some embodiments, the display panel may further include a display device arranged in the display area, a thin film transistor arranged between the substrate and the display device, and a connection electrode electrically connecting the display device with the thin film transistor, the thin film transistor may include a semiconductor layer, a gate electrode at least partially overlapping with the semiconductor layer, and an electrode layer arranged on the gate electrode and electrically connected with the semiconductor layer, and the third conductive layer may include a same material as the connection electrode.

According to some embodiments, the display panel may further include a thin film encapsulation layer arranged on the display portion and including at least one organic encapsulation layer and at least one inorganic encapsulation layer, and a touch sensor layer arranged on the thin film encapsulation layer, the touch sensor layer may include a first touch insulating layer, a first touch electrode layer arranged on the first touch insulating layer, a second touch insulating layer arranged on the first touch electrode layer, and a second touch electrode layer arranged on the second touch insulating layer, and the fourth conductive layer may include a same material as the second touch electrode layer.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
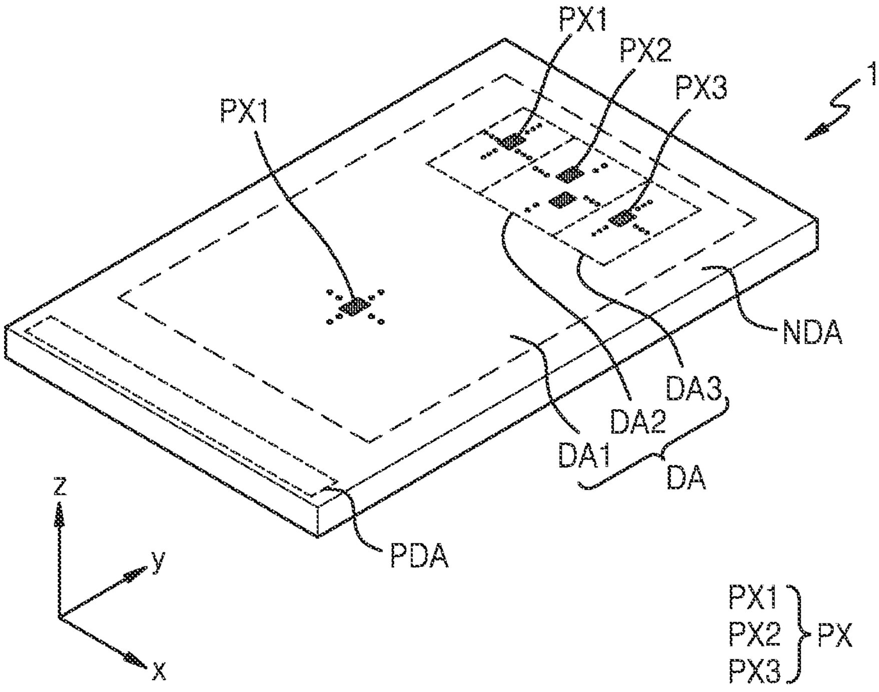
FIG. 1 is a perspective view schematically illustrating an electronic device according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

It will be understood that although terms such as "first" and "second" may be used herein to describe various components, these components should not be limited by these terms and these terms are only used to distinguish one component from another component.

As used herein, the singular forms "a", "an", and "the" are intended to include the plural forms as well, unless the context clearly indicates otherwise.

It will be understood that the terms "comprises" and/or "comprising" used herein specify the presence of stated features or components, but do not preclude the presence or addition of one or more other features or components.

It will be further understood that when a layer, region, or component is referred to as being "on" another layer, region, or component, it may be "directly on" the other layer, region, or component or may be "indirectly on" the other layer, region, or component with one or more intervening layers, regions, or components therebetween.

As used herein, "A and/or B" represents the case of A, B, or A and B. Also, "at least one of A and B" represents the case of A, B, or A and B.

In the following embodiments, it will be understood that when a wire is referred to as "extending in a first direction or a second direction," it cannot only extend in a linear shape, but also can extend in the first direction or the second direction in a zigzag or curved line.

In the following embodiments, when referred to "planar", it means when an object is viewed from above, and when referred to "sectional", it means when a cross section formed by vertically cutting an object is viewed from the side. In the following embodiments, when referred to as "overlapping", it may include overlapping "in a plan view" and overlapping "in a cross-sectional view."

Hereinafter, embodiments will be described in detail with reference to the accompanying drawings, and in the following description, like reference numerals will denote like elements.

FIG. 1 is a perspective view schematically illustrating an electronic device according to some embodiments.

Referring to FIG. 1, an electronic device 1 may include a display area DA and a non-display area NDA outside the display area DA. The display area DA may include a first display area DA1, a second display area DA2, and a third display area DA3. A subpixel PX may be arranged in the first display area DA1, the second display area DA2, and the third display area DA3, and the subpixel PX may not be arranged in the non-display area NDA. The electronic device 1 may provide an image to the outside by using light emitted from the subpixel PX arranged in the display area DA. The non-display area NDA may include at its at least one side a pad area PDA.

The non-display area NDA may at least partially surround the first display area DA1. For example, the non-display area NDA may entirely surround the first display area DA1. A driver, etc. to provide an electrical signal, power, etc., to the first display area DA1 may be arranged in the non-display area NDA. The pad area PDA to which an electronic device or a printed circuit board may be electrically connected may be arranged in the non-display area NDA.

The subpixel PX may be defined as an area in which a display device emits light. Each of a plurality of subpixels PX may emit light, e.g., red light, green light, or white light. Each subpixel PX may be, for example, a red subpixel, a green subpixel, or a blue subpixel. According to some embodiments, the electronic device 1 may include a first subpixel PX1, a second subpixel PX2, and a third subpixel PX3.

The first display area DA1 may at least partially surround the second display area DA2 and the third display area DA3. According to some embodiments, the first display area DA1 may only partially surround the second display area DA2 and the third display area DA3. According to some embodiments, the first display area DA1 may entirely surround the second display area DA2 and the third display area DA3. The first display area DA1 may include the first subpixel PX1. There may be a plurality of first subpixels PX1 in the first display area DA1.

The third display area DA3 may be adjacent to the second display area DA2. The third display area DA3 may be arranged at one side of the second display area DA2. For example, the second display area DA2 and the third display area DA3 may be arranged side-by-side in a first direction (e.g., x direction or −x direction). In another example, the second display area DA2 and the third display area DA3 may be arranged side-by-side in a second direction (e.g., y direction or −y direction). The third display area DA3 may be omitted.

At least one of the second display area DA2 or the third display area DA3 may have various shapes including a circular shape, an elliptical shape, a polygonal shape, such as a tetragonal shape, etc., a star shape, a diamond shape, etc. on a plane (e.g., x-y plane). For example, FIG. 1 illustrates that each of the second display area DA2 and the third display area DA3 has tetragonal shape.

Although FIG. 1 illustrates that the second display area DA2 and the third display area DA3 are arranged at a center of an upper portion (+y direction) of the first display area DA1 having a roughly tetragonal shape when seen in a direction roughly perpendicular to an upper surface of the electronic device 1 (e.g., z direction), the disclosure is not limited thereto. The second display area DA2 and the third display area DA3 may be arranged at, for example, an upper right portion or an upper left portion of the first display area DA1.

At least one of the second display area DA2 or the third display area DA3 may include a transmission area TA (FIG. 2) in which light and/or sound may be transmitted. Moreover, at least one of the second display area DA2 or the third display area DA3 may be an area in which the subpixel PX is arranged. The second subpixel PX2 may be arranged in the second display area DA2. There may be a plurality of second subpixels PX2 in the second display area DA2. The third subpixel PX3 may be arranged in the third display area DA3. There may be a plurality of third subpixels PX3 in the third display area DA3.

According to some embodiments, an image displayed in at least one of the second display area DA2 or the third display area DA3 may have a lower resolution than an image displayed in the first display area DA1. For example, the resolution of the second display area DA2 may be about ½, ⅜, ⅓, ¼, 2/9, ⅛, 1/9, 1/16, etc. of the resolution of the first display area DA1. For example, the resolution of the first display area DA1 may be about 400 ppi or higher, and the resolution of the second display area DA2 may be about 200 ppi or about 100 ppi. According to some embodiments, the resolution of at least one of the second display area DA2 or the third display area DA3 may be identical to the resolution of the first display area DA1.

When the subpixel PX is not arranged in the transmission area TA (FIG. 2), the number of subpixels PX which may be arranged per unit area in at least one of the second display area DA2 or the third display area DA3 may be less than the number of subpixels PX arranged per unit area in the first display area DA1. For example, the number of second subpixels PX2 which may be arranged per unit area in the second display area DA2 may be less than the number of first subpixels PX1 arranged per unit area in the first display area DA1.

At least one of the second display area DA2 or the third display area DA3 may have a high transmittance with respect to light or sound. For example, the transmittance of at least one of the second display area DA2 or the third display area DA3 may be about 10% or more, 25% or more, 40% or more, 50% or more, 85% or more, or 90% or more.

Hereinafter, the case where the electronic device 1 of FIG. 1 is a smartphone is described for convenience in explanation; however, the electronic device 1 of the disclosure is not limited thereto. The electronic device 1 may be applied not only to mobile electronic devices, such as a mobile phone, a smartphone, a table personal computer (PC), a mobile communication terminal, an electronic notebook, an electronic book, a portable multimedia player (PMP), a navigation, an ultra mobile personal computer (UMPC), etc. but also to various products, such as a television, a notebook, a monitor, an advertisement board, internet of things (IOT), etc. In addition, the electronic device 1 may be used in wearable devices including smartwatches, watch phones, glasses-type displays, and head-mounted displays (HMD). Moreover, the electronic device 1 may be used as instrument panels for automobiles, center fascia for automobiles, or center information displays (CID) arranged on a dashboard, room mirror displays that replace side mirrors of automobiles, and displays arranged on the backside of front seats as an entertainment for back seats of automobiles.

Figure 2A:
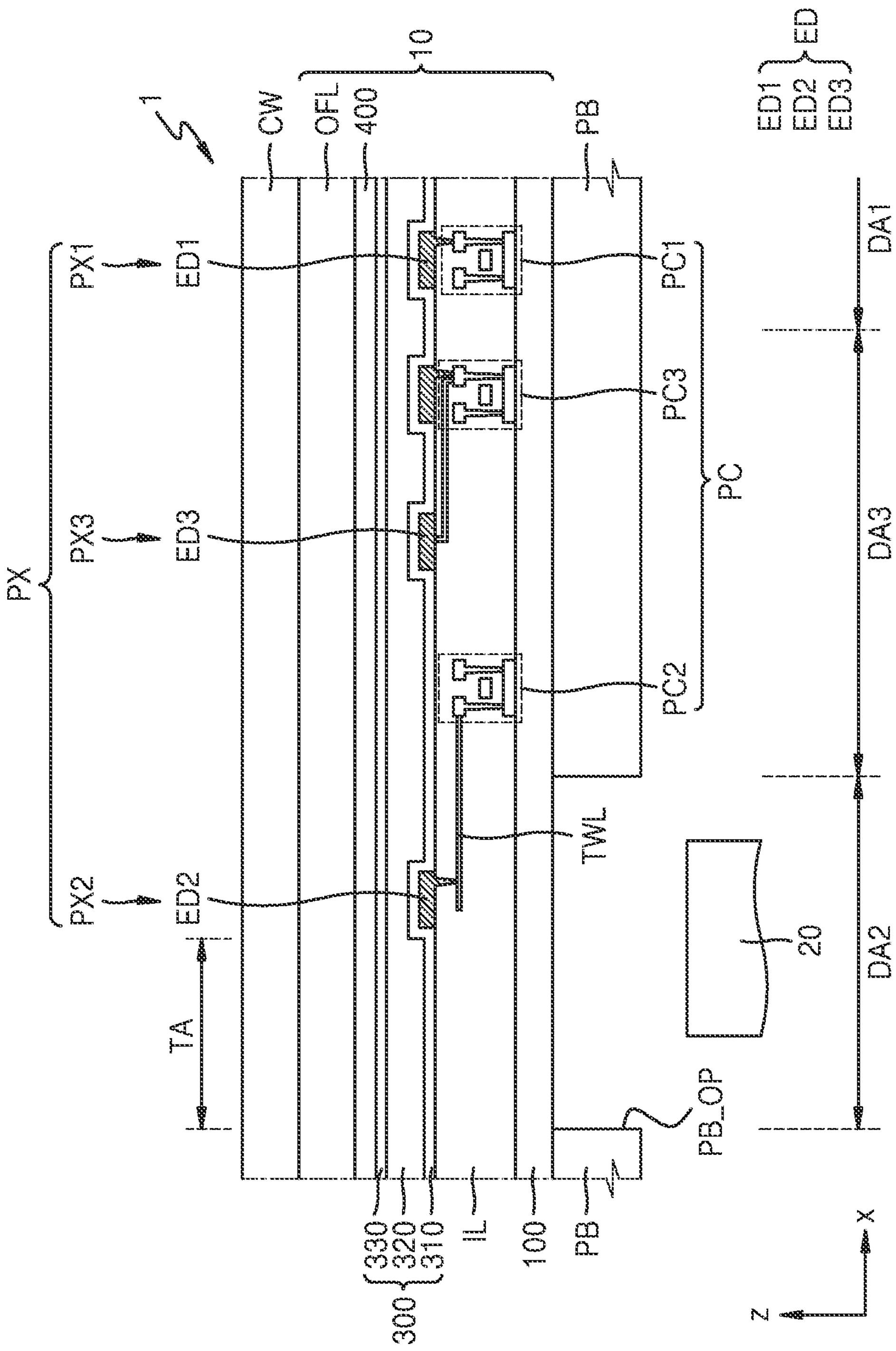
FIGS. 2A and 2B are cross-sectional views schematically illustrating an electronic device according to some embodiments.
Figure 2B:
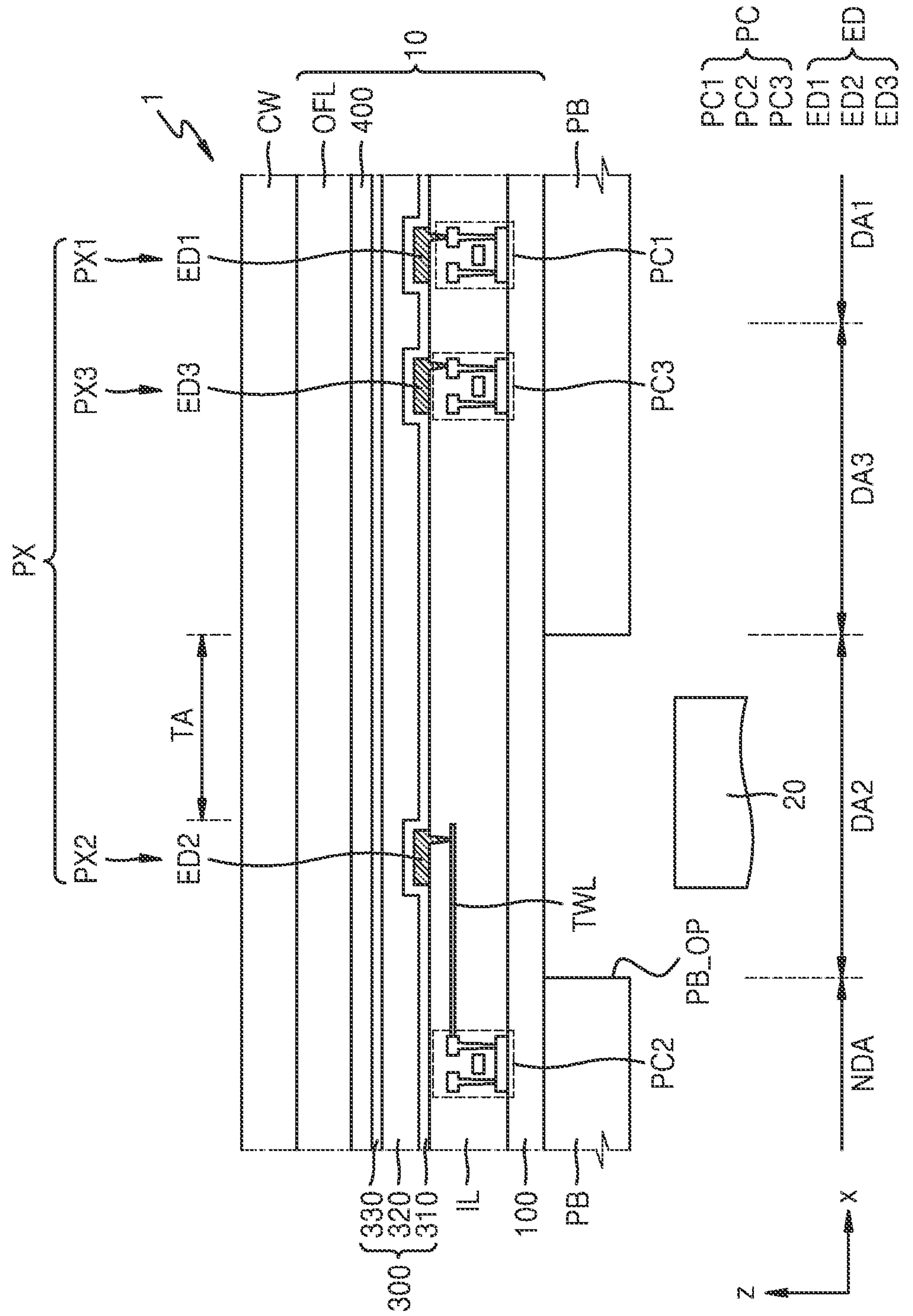

FIGS. 2A and 2B are cross-sectional views schematically illustrating an electronic device according to some embodiments.

Referring to FIGS. 2A and 2B, the electronic device 1 may include a display panel 10 and a component 20 arranged on a rear surface (bottom surface) of the display panel 10. The display panel 10 may include a substrate 100, a display portion, an encapsulation member, a touch sensor layer 400, an optical functional layer OFL, a cover window CW, and a panel protection member PB arranged on a bottom surface of the substrate 100. The display portion may include an insulating layer IL, a subpixel circuit PC, and a display device ED. The encapsulation member may be an encapsulation layer 300.

The display panel 10 may include the first display area DA1, the second display area DA2, and the third display area DA3. In other words, the first display area DA1, the second display area DA2, and the third display area DA3 may be defined in the substrate 100 and a multi-layer film on the substrate 100. Hereinafter, embodiments are described in detail under the premise that the substrate 100 includes the first display area DA1, the second display area DA2, and the third display area DA3.

The substrate 100 may include an insulating material, such as glass, quartz, a polymer resin, or the like. The substrate 100 may include a rigid substrate or a flexible substrate that is bendable, foldable, or rollable.

The insulating layer IL and the subpixel circuit PC may be arranged on the substrate 100. The insulating layer IL may insulate components of the display panel 10. The insulating layer IL may include at least one of an organic material or an inorganic material.

The subpixel circuit PC may be electrically connected with the display device ED to drive the display device ED. The subpixel circuit PC may be arranged in the insulating layer IL. According to some embodiments, the subpixel circuit PC may include a first subpixel circuit PC1, a second subpixel circuit PC2, and a third subpixel circuit PC3. The first subpixel circuit PC1 may be arranged in the first display area DA1. The second subpixel circuit PC2 and the third subpixel circuit PC3 may be arranged in the third display area DA3. According to some embodiments, the subpixel circuit PC may not be arranged in the second display area DA2. In this case, the transmittance (e.g., optical transmittance) of the display panel 10 in the second display area DA2 may be relatively higher than the transmittance of the display panel 10 in the first display area DA1 and the third display area DA3.

The display device ED may be arranged on the insulating layer IL. According to some embodiments, the display device ED may be an organic light-emitting diode including an organic light-emitting layer. However, embodiments according to the present disclosure are not limited thereto. According to some embodiments, the display device ED of the disclosure may be a light-emitting diode including an inorganic material, or a quantum dot light-emitting diode including quantum dots. For example, the emission layer of the display device ED may include an organic material, an inorganic material, quantum dots, an organic material and quantum dots, or an inorganic material and quantum dots. Hereinafter, the case where the display device ED is an organic light-emitting diode is described in detail.

The display panel 10 may include a plurality of display devices ED. The plurality of display devices ED may be arranged in the first display area DA1, the second display area DA2, and the third display area DA3. According to some embodiments, the display device ED may emit light to implement the subpixel PX. For example, first display devices ED1 arranged in the first display area DA1 may emit light to implement the first subpixel PX1. Second display devices ED2 arranged in the second display area DA2 may emit light to implement the second subpixels PX2. Third display devices ED3 arranged in the third display area DA3 may emit light to implement the third subpixels PX3.

According to some embodiments, as illustrated in FIG. 2A, the second subpixel circuit PC2 driving the second display device ED2 may not be arranged in the second display area DA2 and be arranged in the third display area DA3 between the first display area DA1 and the second display area DA2. According to some embodiments, as illustrated in FIG. 2B, the second subpixel circuit PC2 driving the second display device ED2 may not be arranged in the third display area DA3 but arranged in the non-display area NDA. That is, the second subpixel circuit PC2 may not overlap with the second display device ED2.

According to some embodiments, as illustrated in FIG. 2A, the second subpixel circuit PC2 arranged in the third display area DA3 may be electrically connected to the second display device ED2 arranged in the second display area DA2 through a connection wire TWL. In this case, the connection wire TWL may extend from the third display area DA3 to the second display area DA2. The connection wire TWL may be arranged in the second display area DA2 and the third display area DA3. Moreover, according to some embodiments, as illustrated in FIG. 2B, the second subpixel circuit PC2 arranged in the non-display area NDA may be electrically connected to the second display device ED2 arranged in the second display area DA2 through the connection wire TWL. The connection wire TWL may extend from the non-display area NDA to the second display area DA2. The connection wire TWL may be arranged in the second display area DA2 and the non-display area NDA.

The transmission area TA may be defined as an area of the second display area DA2, in which the second subpixel PX2 is not arranged. The transmission area TA may be an area through which light/signals emitted from or incident into the component 20 arranged to correspond to the second display area DA2 may pass. The connection wire TWL connecting the second subpixel circuit PC2 with the second display device ED2 may be arranged in the transmission area TA. As the connection wire TWL may include a transparent conductive material having a high transmittance, even when the connection wire TWL is arranged in the transmission area TA, the transmittance of the transmission area TA may be secured.

The encapsulation member may cover the display device ED. The encapsulation member may be the encapsulation layer 300 or a sealing substrate. According to some embodiments, the encapsulation member may be the encapsulation layer 300 and include at least one inorganic encapsulation layer and at least one organic encapsulation layer. For example, the encapsulation layer 300 may include a first inorganic encapsulation layer 310, a second inorganic encapsulation layer 330, and an organic encapsulation layer 320 arranged between the first and second encapsulation layers 310 and 330.

The touch sensor layer 400 may obtain coordinate information according to an external input, for example, a touch event. The touch sensor layer 400 may include a touch electrode and touch wires connected to the touch electrode. The touch sensor layer 400 may sense an external input based on a magnetic capacitance method or a mutual capacitance method.

The touch sensor layer 400 may be arranged on the encapsulation layer 300. Alternatively, the touch sensor layer 400 may be separately formed on a touch substrate and then may be coupled onto the encapsulation layer 300 through an adhesive layer, such as an optical clear adhesive (OCA). According to some embodiments, the touch sensor layer 400 may be arranged directly on the encapsulation layer 300, and in this case, the adhesive layer may not be arranged between the touch sensor layer 400 and the encapsulation layer 300.

The optical functional layer OFL may include an anti-reflection layer. The anti-reflection layer may reduce a reflectivity of light (external light) incident from the outside towards the display panel 10. According to some embodiments, the optical functional layer OFL may include a polarization film. Alternatively, the optical functional layer OFL may be provided as a filter plate including a black matrix and color filters. The cover window CW may be arranged on the display panel 10. The cover window CW may protect the display panel 10. The cover window CW may include at least one of glass sapphire, or plastic. The cover window CW may be, for example, ultra-thin glass (UTG) or colorless polyimide (CPI).

The panel protection member PB may be arranged under the substrate 100. The panel protection member PB may support and protect the substrate 100. According to some embodiments, an opening PB_OP overlapping with the second display area DA2 may be defined in the panel protection member PB. In some embodiments, the opening PB_OP of the panel protection member PB may overlap with the second display area DA2 and the third display area DA3. The panel protection member PB may include polyethylene terephthalate or polyimide.

The component 20 may be arranged under the display panel 10. According to some embodiments, the component 20 may be arranged opposite to the cover window CW, with the display panel 10 arranged therebetween. According to some embodiments, the component 20 may overlap with the second display area DA2. According to some embodiments, the component 20 may overlap with the second display area DA2 and the third display area DA3.

The component 20 may be a camera using infrared or visible light, and may include an imaging device. Alternatively, the component 20 may be a solar cell, a flash, a luminance sensor, a proximity sensor, or an iris sensor. Alternatively, the component may have a function of receiving sound. To minimize limitation in such functions of the component 20, the second subpixel circuit PC2 may not be arranged in the second display area DA2 in which the component 20 is arranged. That is, the second subpixel circuit PC2 driving the second display device ED2 arranged in the second display area DA2 may not be arranged in the second display area DA2 but arranged in the third display area DA3. Accordingly, the transmittance (e.g., optical transmittance) of the display panel 10 in the second display area DA2 may be higher than the transmittance (e.g., optical transmittance) of the display panel 10 in the third display area DA3.

Figure 3A:
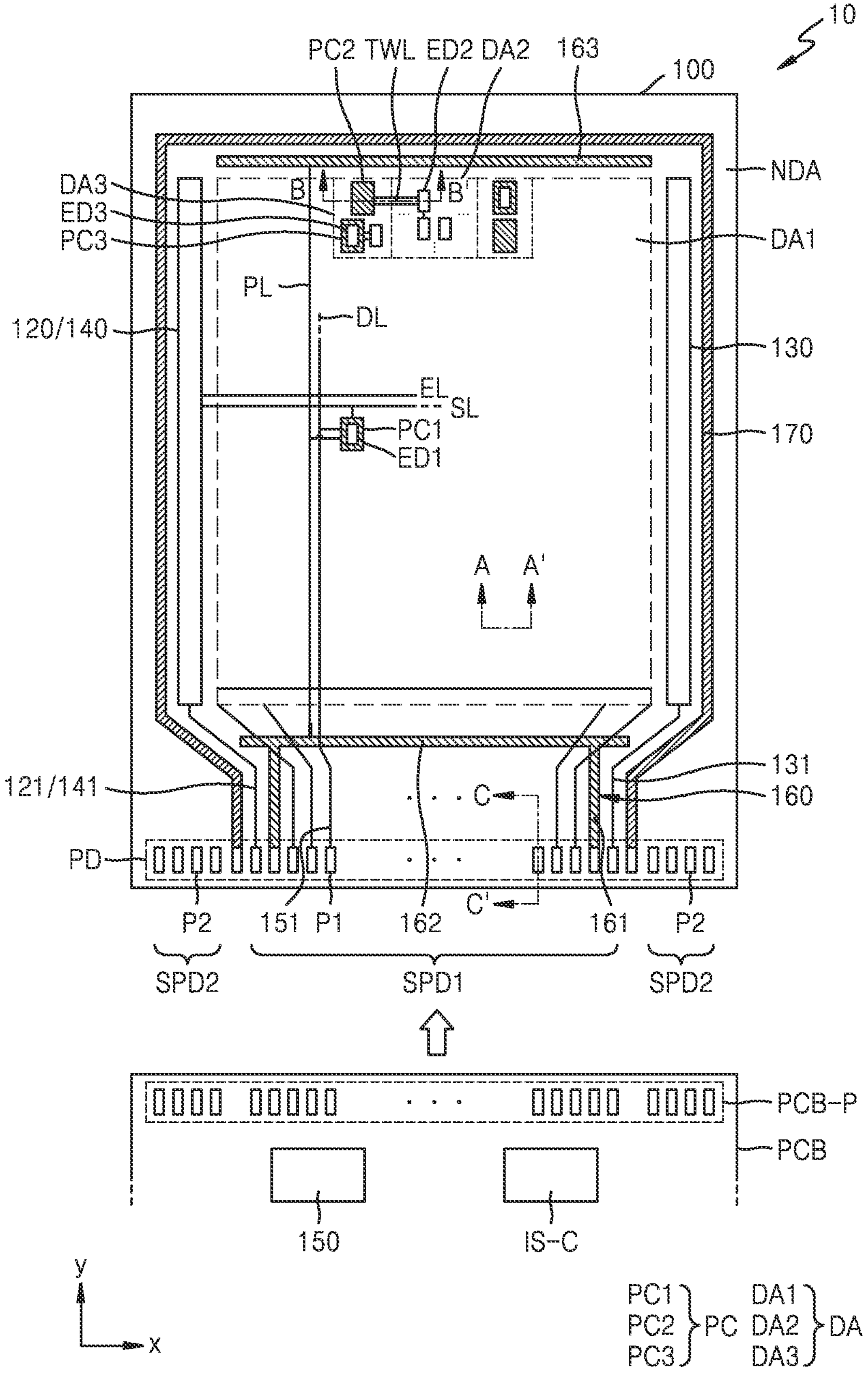
FIGS. 3A and 3B are plan views schematically illustrating a display panel according to some embodiments.
Figure 3B:
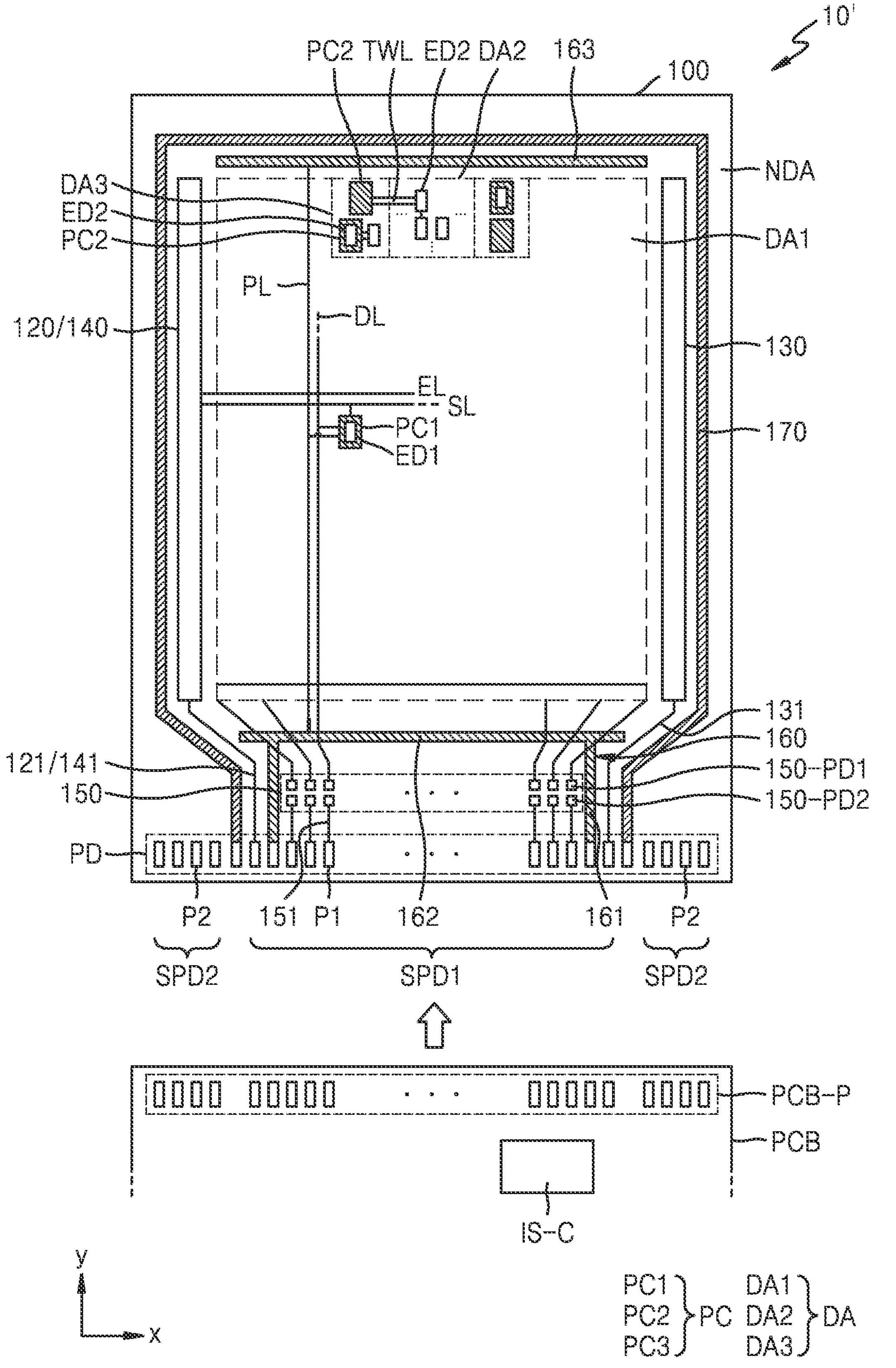

FIGS. 3A and 3B are plan views schematically illustrating a display panel according to some embodiments.

Referring to FIG. 3A, the substrate 100 of the display panel 10 may include the display area DA and the non-display area NDA. The display area DA may include the first display area DA1, the second display area DA2, and the third display area DA3.

The display panel 10 may include a plurality of subpixels PX arranged in the display area DA, e.g., the first display area DA1, the second display area DA2, and the third display area DA3. A light-emitting diode of each of the subpixel PX may emit, for example, red light, green light, blue light, or white light.

The subpixel circuits PC driving the subpixels PX in the display area DA may each be connected to a signal line or a voltage line to control on/off, luminance, etc. of each display device. For example, FIGS. 3A and 3B illustrate, as a signal line, a scan line SL extending in the first direction (e.g., x direction) and a data line DL extending in the second direction (e.g., y direction) and as a voltage line, a driving voltage line PL.

The first display device ED1 corresponding to the first subpixel PX1 (FIG. 2A) may be arranged in the first display area DA1. The first subpixel circuit PC1 connected to the first display device ED1 may be arranged in the first display area DA1, and may overlap with the first display device ED1.

The second display device ED2 corresponding to the second subpixel PX2 (FIG. 2A) may be arranged in the second display area DA2. Referring to FIG. 3A, the second display device ED2 may be arranged in the second display area DA2, and the second subpixel circuit PC2 may be arranged in the third display area DA3. The second display device ED2 may be connected with the second subpixel circuit PC2 through the connection wire TWL. According to some embodiments, the second display device ED2 may be arranged in the second display area DA2, and the second subpixel circuit PC2 may be arranged in the non-display area NDA.

The third display device ED3 corresponding to the third subpixel PX3 (FIG. 2A) may be arranged in the third display area DA3. The third subpixel circuit PC3 connected to the third display device ED3 may be arranged in the third display area DA3.

Each of the first to third subpixel circuits PC1, PC2, and PC3 may be electrically connected to outer circuits arranged in the non-display area NDA. In the non-display area NDA, a first scan driver circuit 120, a second scan driver circuit 130, an emission control driver circuit 140, a first power supply wire 160, and a second power supply wire 170 may be arranged.

The first scan driver circuit 120 and the second scan driver circuit 130 may provide a scan signal to each subpixel PX through the scan line SL. The second scan driver circuit 130 may be arranged side-by-side with the first scan driver circuit 120, with the display area DA arranged therebetween. Some of the subpixels PX arranged in the display area DA may be electrically connected with the first scan driver circuit 120 and the others may be electrically connected with the second scan driver circuit 130. According to some embodiments, the second scan driver circuit 130 may be omitted.

The emission control driver circuit 140 may be located at one side of the display area DA. The emission control driver circuit 140 may provide an emission control signal to each subpixel PX through an emission control line EL.

A pad portion PD may be arranged at one side of the substrate 100. The pad portion PD may include a plurality of pads P. The plurality of pads P may be exposed by not being covered with an insulating layer and thus electrically connected to a printed circuit board PCB. A pad portion PCB-P of the printed circuit board PCB may be electrically connected to the pad portion PD of the display panel 10. The printed circuit board PCB may be a rigid circuit board or a flexible circuit board. The printed circuit board PCB may be directly connected to the display panel 10 or indirectly connected to the display panel 10 through other circuit boards.

According to some embodiments, a data driver circuit 150 controlling operations of the display panel 10 may be arranged in the printed circuit board PCB. Moreover, an input sensor circuit IS-C controlling the touch sensor layer 400 may be arranged in the printed circuit board PCB. According to some embodiments as shown in FIG. 3A, the data driver circuit 150 and the input sensor circuit IS-C may be mounted on the printed circuit board PCB as a single integrated chip. The printed circuit board PCB may include a printed circuit board pad portion PCB-P electrically connected to the display panel 10. According to some embodiments, the printed circuit board PCB may further include signal lines connecting the printed circuit board pad portion PCB-P with the data driver circuit 150 and/or the input sensor circuit IS-C.

The first power supply wire 160 may include a first sub-wire 162 and a second sub-wire 163 which extend side-by-side in the first direction (e.g., x direction), with the display area DA arranged therebetween, and supply a first power voltage (e.g., ELVDD) through a power transfer line 161 extending in the second direction (e.g., y direction). The first power voltage may be supplied to the subpixel circuit PC of each subpixel PX through the driving voltage line PL connected with the first power supply wire 160. The second power supply wire 170 partially surrounding the display area DA may be arranged in the non-display area NDA. For example, the second power supply wire 170 may have a loop shape open to the pad portion PD. A second power voltage (e.g., ELVSS) may be transmitted to the second power supply wire 170, and may be supplied to an opposite electrode of each subpixel PX connected with the second power supply wire 170.

The pad portion PD may be arranged in the pad area PDA (FIG. 1) of the non-display area NDA. The pad portion PD may include pads (e.g., P1 and P2) sequentially arranged apart from each other at a certain distance. The pad portion PD may include a first sub-pad portion SPD1. The first sub-pad portion SPD1 may include a plurality of first pads P1 transmitting an electrical signal to the subpixel circuit PC. The plurality of first pads P1 may be connected to an end of a signal transmission line 151 connected with the data line DL extending into the non-display area NDA. Some of the plurality of first pads P1 may be respectively connected with signal transmission lines 121, 131, and 141 connected with driver circuits (120, 130, and 140) and with an end of the power transfer line 161 connected to the first power supply wire 160.

The pad portion PD may further include second sub-pad portions SPD2 arranged at each side of the first sub-pad portion SPD1. The second sub-pad portion SPD2 may include a plurality of second pads P2 transmitting an electrical signal to the touch sensor layer 400. The plurality of second pads P2 may be optionally provided when the touch sensor layer 400 is directly arranged on the encapsulation layer 300, or may be omitted when the touch sensor layer 400 is provided as a separate panel and attached onto the encapsulation layer 300. The plurality of second pads P2 may be provided as floating electrodes, and may be electrically insulated from the signal lines connected with the subpixel PX. The plurality of second pads P2 may overlap with a pad portion included in the touch sensor layer 400.

A display panel 10' of FIG. 3B is substantially identical to the display panel of FIG. 3A except that the data driver circuit 150 is arranged directly on the substrate 100 of the display panel 10' instead of printed circuit board PCB. As described above, the data driver circuit 150 may be provided as a chip, and in FIG. 3B, first chip pads 150-PD1 and second chip pads 150-PD2 may be provided where the data driver circuit 150 is mounted. Each of the first chip pads 150-PD1 may be connected with the data line DL, and the second chip pads 150-PD2 may be connected with the plurality of first pads P1 through the signal transmission lines 151. The data driver circuit 150 may be connected with first chip pads TC-PD1 and second chip pads TC-PD2. Ultimately, the data line DL may be electrically connected with the pad portion PD through the data driver circuit 150 provided as a control circuit chip.

Figure 4A:
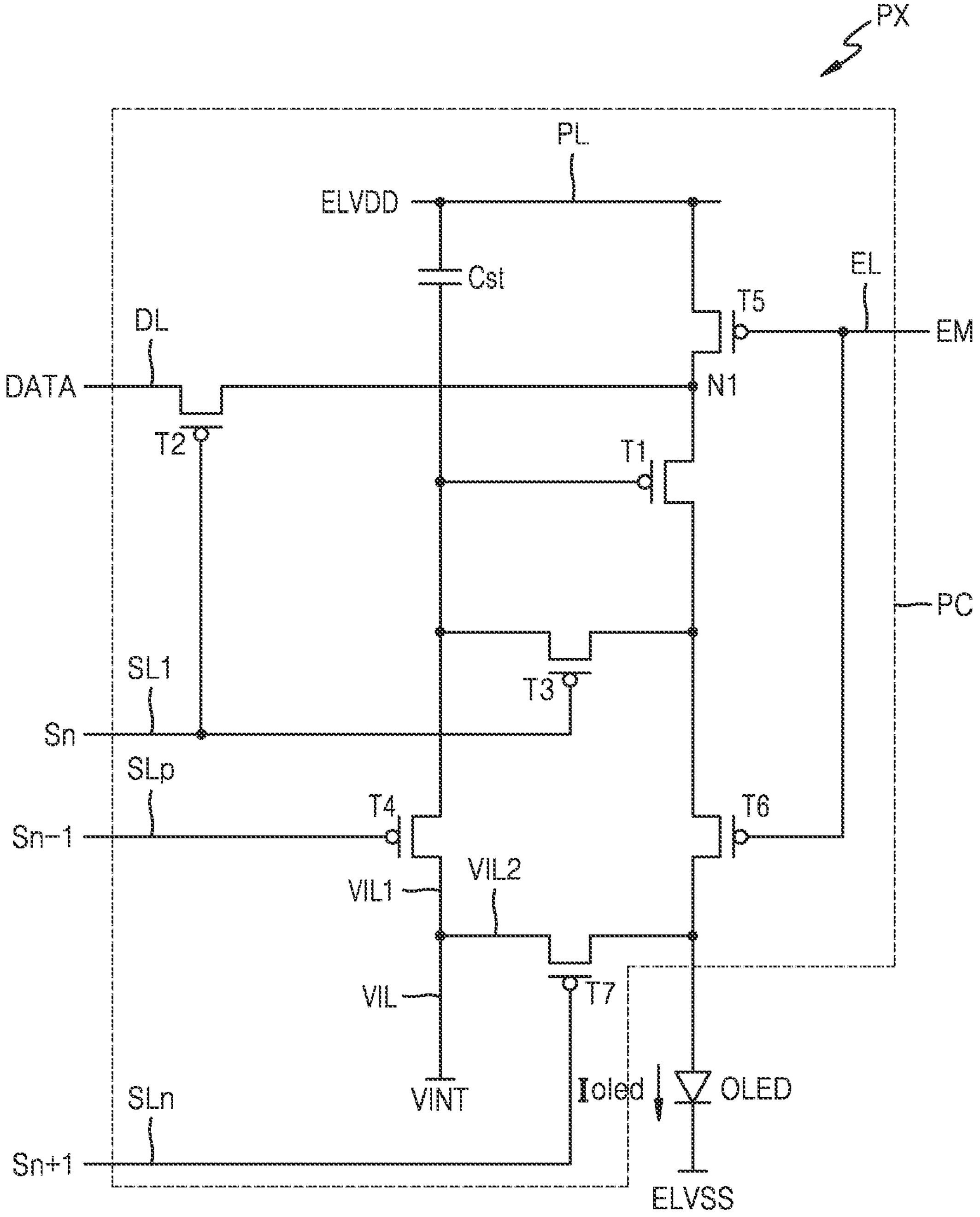
FIGS. 4A and 4B are equivalent circuit diagrams schematically illustrating a light-emitting diode and a subpixel circuit arranged in a display panel according to some embodiments.
Figure 4B:
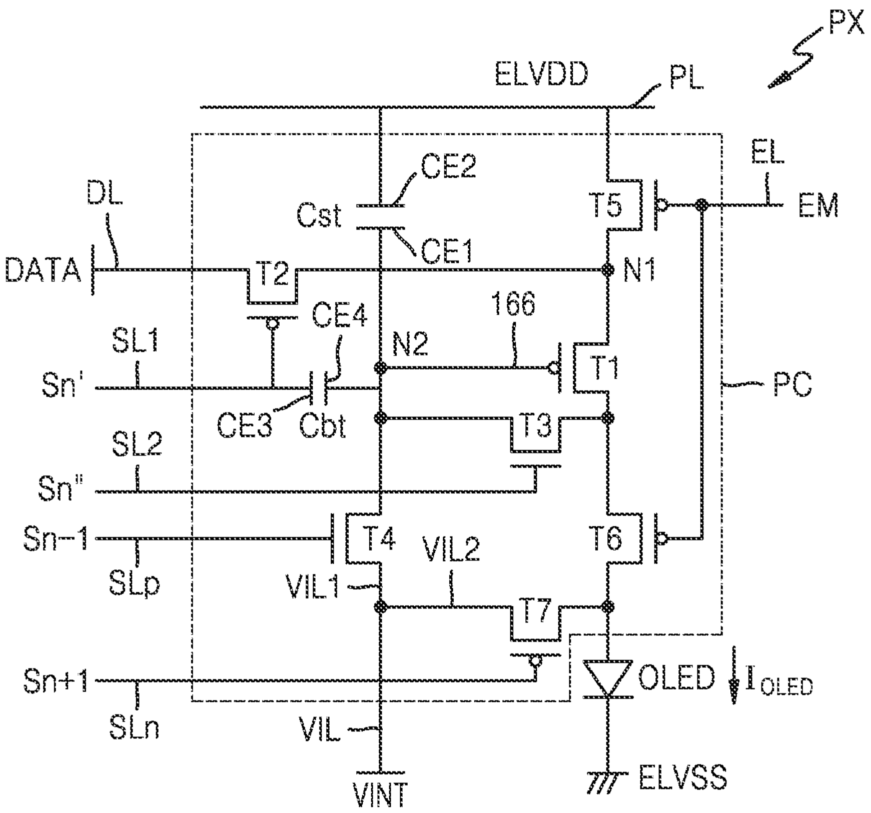

FIGS. 4A and 4B are equivalent circuit diagrams schematically illustrating a light-emitting diode of a display device and a subpixel circuit electrically connected thereto according to some embodiments.

The subpixel circuit PC illustrated in FIG. 4A and FIG. 4B may correspond to the first subpixel circuit PC1, the second subpixel circuit PC2, and the third subpixel circuit PC3 described with reference to FIGS. 3A and 3B.

An organic light-emitting diode OLED illustrated in FIGS. 4A and 4B may correspond to the first display device ED1, the second display device ED2, and the third display device ED3 described with reference to FIGS. 3A and 3B.

The subpixel circuit PC may include a plurality of thin film transistors T1 to T7 and a capacitor Cst. In an embodiments, the plurality of thin film transistors T1 to T7 may include a driving transistor T1, a switching transistor T2, a compensation transistor T3, a first initialization transistor T4, an operation control transistor T5, an emission control transistor T6, and a second initialization transistor T7. However, the disclosure is not limited thereto.

The organic light-emitting diode OLED may include a subpixel electrode and an opposite electrode, and the subpixel electrode of the organic light-emitting diode OLED may be connected with the driving transistor T1 via the emission control transistor T6 and receive driving current, and the opposite electrode may receive a common voltage ELVSS. The organic light-emitting diode OLED may generate light having a certain luminance according to the driving current.

According to some embodiments, the plurality of thin film transistors T1 to T7 may all be PMOS transistors. The plurality of thin film transistors T1 to T7 may include amorphous silicon or polycrystalline silicon.

The signal line may include a first scan line SL1, a previous scan line SLp, a next scan line SLn, the emission control line EL, and the data line DL. However, the disclosure is not limited thereto. The first scan line SL1 may transmit a first scan signal Sn to the switching transistor T2 and the compensation transistor T3. The previous scan line SLp may transmit a previous scan signal Sn−1 to the first initialization transistor T4. The next scan line SLn may transmit a next scan signal Sn+1 to the second initialization transistor T7. The emission control line EL may transmit an emission control signal EM to the operation control transistor T5 and the emission control transistor T6. The data line DL may transmit a data signal DATA to the switching transistor T2.

The driving voltage line PL may transmit a driving voltage ELVDD to the driving transistor T1, and an initialization voltage line VIL may transmit an initialization voltage VINT initializing the driving transistor T1 and the organic light-emitting diode OLED to the subpixel PX. For example, a first initialization voltage line VIL1 may transmit the initialization voltage VINT to the first initialization transistor T4, and a second initialization voltage line VIL2 may transmit the initialization voltage VINT to the second initialization transistor T7.

A driving gate electrode of the driving transistor T1 may be connected with the capacitor Cst, at least one of a source area or a drain area of the driving transistor T1 may be connected with the driving voltage line PL via the operation control transistor T5 through a first node N1, and the other one of the source area and the drain area of the driving transistor T1 may be electrically connected with a subpixel electrode of the organic light-emitting diode OLED via the emission control transistor T6. The driving transistor T1 may receive the data signal DATA according to a switching operation of the switching transistor T2 and supply a driving current Ioled to the organic light-emitting diode OLED.

A switching gate electrode of the switching transistor T2 may be connected to the first scan line SL1 transmitting the first scan signal Sn to the switching transistor T2, at least one of a source area or a drain area of the switching transistor T2 may be connected to the data line DL, and the other one of the source area and the drain area of the switching transistor T2 may be connected to the driving transistor T1 through the first node N1 and connected to the driving voltage line PL via the operation control transistor T5. The switching transistor T2 may be turned on according to the first scan signal Sn transmitted through the first scan line SL1 and perform the switching operation transmitting the data signal DATA transmitted through the data line DL to the driving transistor T1 through the first node N1.

A compensation gate electrode of the compensation transistor T3 may be connected to the first scan line SL1. At least one of a source area or a drain area of the compensation transistor T3 may be connected to a subpixel electrode of the organic light-emitting diode OLED via the emission control transistor T6. The other one of the source area and the drain area of the compensation transistor T3 may be connected to the capacitor Cst and the driving gate electrode of the driving transistor T1. The compensation transistor T3 may be turned on according to the first scan signal Sn received through the first scan line SL1 and diode-connect the driving transistor T1.

A first initialization gate electrode of the first initialization transistor T4 may be connected to the previous scan line SLp. At least one of a source area or a drain area of the first initialization transistor T4 may be connected to the first initialization voltage line VIL1. The other one of the source area and the drain area of the first initialization transistor T4 may be connected to a first capacitor electrode CE1 of the capacitor Cst and the driving gate electrode of the driving transistor T1. The first initialization transistor T4 may be turned on according to the previous scan signal Sn−1 received through the previous scan line SLp and may perform an initialization operation initializing a voltage of the driving gate electrode of the driving transistor T1 by transmitting the initialization voltage VINT to the driving electrode of the driving transistor T1.

An operation control gate electrode of the operation control transistor T5 may be connected to the emission control line EL, at least one of a source area or a drain area of the operation control transistor T5 may be connected to the driving voltage line PL, and the other one may be connected to the driving transistor T1 and the switching transistor T2 through the first node N1.

An emission control gate electrode of the emission control transistor T6 may be connected to the emission control line EL, at least one of a source area or a drain area of the emission control transistor T6 may be connected to the driving transistor T1 and the compensation transistor T3, and the other one of the source area and the drain area of the emission control transistor T6 may be electrically connected to the subpixel electrode of the organic light-emitting diode OLED.

The operation control transistor T5 and the emission control transistor T6 may be simultaneously turned on according to the emission control signal EM received through the emission control line EL, and the driving voltage ELVDD may be transmitted to the organic light-emitting diode OLED such that the driving current Ioled flows in the organic light-emitting diode OLED.

A second initialization gate electrode of the second initialization transistor T7 may be connected to the next scan line SLn, at least one of a source area or a drain area of the second initialization transistor T7 may be connected to the subpixel electrode of the organic light-emitting diode OLED, and the other one of the source area and the drain area of the second initialization transistor T7 may be connected to the second initialization voltage line VIL2 to receive the initialization voltage VINT. The second initialization transistor T7 may be turned on according to the next scan signal Sn+1 received through the next scan line SLn and initialize the subpixel electrode of the organic light-emitting diode OLED. The next scan line SLn may be identical to the first scan line SL1. In this case, the scan line may function as the first scan line SL1 or the next scan line SLn by transmitting a same electrical signal at a certain time interval. According to some embodiments, the second initialization transistor T7 may be omitted.

The capacitor Cst may be connected with the driving voltage line PL and the driving gate electrode of the driving transistor T1, and may store and maintain a voltage corresponding to a voltage difference between both ends of the driving voltage line PL and the driving gate electrode of the driving transistor T1 to maintain a voltage applied to the driving gate electrode of the driving transistor T1.

Specific operations of the subpixel circuit PC and the organic light-emitting diode OLED, which is a display element, according to some embodiments are as follows.

During an initialization period, when the previous scan signal Sn−1 is supplied through the previous scan line SLp, the first initialization transistor T4 may be turned on in response to the previous scan signal Sn−1, and the driving transistor T1 may be initialized by the initialization voltage VINT supplied from the first initialization voltage line VIL1.

During a data programming period, when the first scan signal Sn is supplied through the first scan line SL1, the switching transistor T2 and the compensation transistor T3 may be turned on in response to the first scan signal Sn. At this time, the driving transistor T1 may be diode-connected by the turned-on compensation transistor T3 and biased in a forward direction. Then, a compensation voltage DATA+Vth (Vth has a negative value), which is a voltage reduced from the data signal DATA supplied from the data line DL by a threshold voltage Vth of the driving transistor T1, may be applied to the driving gate electrode of the driving transistor T1. The driving voltage ELVDD and the compensation voltage DATA+Vth may be applied to both ends of the capacitor Cst, and a charge corresponding to a voltage difference between the both ends of the driving gate electrode of the driving transistor T1 and the driving voltage line PL may be stored in the capacitor Cst.

During the emission periods, the operation control transistor T5 and the emission control transistor T6 may be turned on by the emission control signal EM supplied from the emission control line EL. A driving current corresponding to a voltage difference between a voltage of the driving gate electrode of the driving transistor T1 and the driving voltage ELVDD may be generated, and the driving current Ioled may be supplied to the organic light-emitting diode OLED through the emission control transistor T6.

With reference to FIG. 4B, the subpixel circuit PC of the subpixel PX may include the plurality of thin film transistors T1 to T7, a first capacitor Cst, a second capacitor Cbt, and the organic light-emitting diode OLED as a display element.

Some of the plurality of thin film transistors T1 to T7 may be n-channel MOSFET (NMOS) transistors, and the rest may be p-channel MOSFET (PMOS) transistors. For example, as illustrated in FIG. 4B, among the plurality of thin film transistors T1 to T7, the compensation transistor T3 and the first initialization transistor T4 may be NMOS transistors and the rest may be PMOS transistors. Alternatively, among the plurality of thin film transistors T1 to T7, the compensation transistor T3, the first initialization transistor T4, and the second initialization transistor T7 may be NMOS transistors, and the reset may be PMOS transistors. All of the plurality of thin film transistors T1 to T7 may be NMOS transistors. The plurality of thin film transistors T1 to T7 may include amorphous silicon or polycrystalline silicon. The NMOS transistor may include an oxide semiconductor when necessary.

The signal line may include a first scan line SL1 transmitting a first scan signal Sn', a second scan line SL2 transmitting a second scan signal Sn", a previous scan line SLp transmitting a previous scan signal Sn−1 to the first initialization transistor T4, an emission control line EL transmitting an emission control signal EM to the operation control transistor T5 and the emission control transistor T6, a next scan line SLn transmitting a next scan signal Sn+1 to the second initialization transistor T7, and a data line DL transmitting a data signal DATA to the switching transistor T2.

The driving transistor T1 may be connected to the driving voltage line PL via the operation control transistor T5, and may be electrically connected to the organic light-emitting diode OLED via the emission control transistor T6. The driving transistor T1 may receive the data signal DATA according to a switching operation of the switching transistor T2 and supply a driving current Ioled to the organic light-emitting diode OLED.

The switching transistor T2 may be connected to the first scan line SL1 and the data line DL, and may be connected to the driving voltage line PL via the operation control transistor T5. The switching transistor T2 may be turned on according to the first scan signal Sn' transmitted through the first scan line SL1 and perform the switching operation transmitting the data signal DATA transmitted through the data line DL to the first node N1.

The compensation transistor T3 may be connected to the second scan line SL2, and may be connected to the organic light-emitting diode OLED via the emission control transistor T6. The compensation transistor T3 may be turned on according to the scan signal Sn" received through the second scan line SL2, and may compensate for a threshold voltage of the driving transistor T1 by diode-connecting the driving transistor T1.

The first initialization transistor T4 may be connected to the previous scan line SLp and the first initialization voltage line VIL1, be turned on according to the previous scan signal Sn−1 received through the previous scan line SLp, and transmit the initialization voltage VINT from the first initialization voltage line VIL1 to the gate electrode of the driving transistor T1 to initialize the gate electrode of the driving transistor T1.

The operation control transistor T5 and the emission control transistor T6 may be connected to the emission control line EL, be simultaneously turned on according to the emission control signal EM received through the emission control line EL, and form a current path such that the driving current Ioled may flow from the driving voltage line PL towards the organic light-emitting diode OLED.

The second initialization transistor T7 may be connected to the next scan line SLn and the second initialization voltage line VIL2, be turned on according to the next scan signal Sn+1 received through the next scan line SLn, and transmit the initialization voltage VINT from the second initialization voltage line VIL2 to the organic light-emitting diode OLED to initialize the organic light-emitting diode OLED. The second initialization transistor T7 may be omitted.

The first capacitor Cst may include the first capacitor electrode CE1 and a second capacitor electrode CE2. The first capacitor electrode CE1 may be connected to the driving transistor T1, and the second capacitor electrode CE2 may be connected to the driving voltage line PL. The first capacitor Cst may store and maintain a voltage corresponding to a voltage difference between both ends of the gate electrode of the driving transistor T1 to maintain a voltage applied to the gate electrode of the driving transistor T1.

The second capacitor Cbt may include a third capacitor electrode CE3 and a fourth capacitor electrode CE4. The third capacitor electrode CE3 may be connected to the first scan line SL1 and the gate electrode of the switching transistor T2. The fourth capacitor electrode CE4 may be connected to the gate electrode of the driving transistor T1 and the first capacitor electrode CE1 of the first capacitor Cst. The second capacitor Cbt may be a boosting capacitor, and when the first scan signal Sn of the first scan line SL1 is a voltage turning on the switching transistor T2, the second capacitor Cbt may raise a voltage of a second node N2 to clearly express a black grayscale.

According to some embodiments, at least one of the plurality of transistors T1 to T7 may include a semiconductor layer including an oxide, and the rest may include a semiconductor layer including amorphous silicon or polycrystalline silicon.

For example, the first thin film transistor directly influencing the brightness of the display panel 10 may include a semiconductor layer including polycrystalline silicon having a high reliability, and through this, a high-resolution display device may be implemented.

In addition, as an oxide semiconductor has a high carrier mobility and a low leakage current, a voltage drop may not be large even though a driving time is long. That is, even during a low-frequency driving, a color change of an image according to a voltage drop may not be large and thus a display device may be driven at low frequencies.

As an oxide semiconductor may have relatively less leakage current, by employing at least one of the compensation transistor T3 or the first initialization transistor T4 which are connected to the gate electrode of the driving transistor T1, as an oxide semiconductor, not only the leakage current that may flow into the gate electrode of the driving transistor T1 may be prevented, but also the power consumption may be reduced.

The subpixel circuit PC is not limited to the number and circuit design of the thin film transistor described with reference to FIGS. 4A and 4B, and the number and the circuit design thereof may be variously changed.

Figure 5:
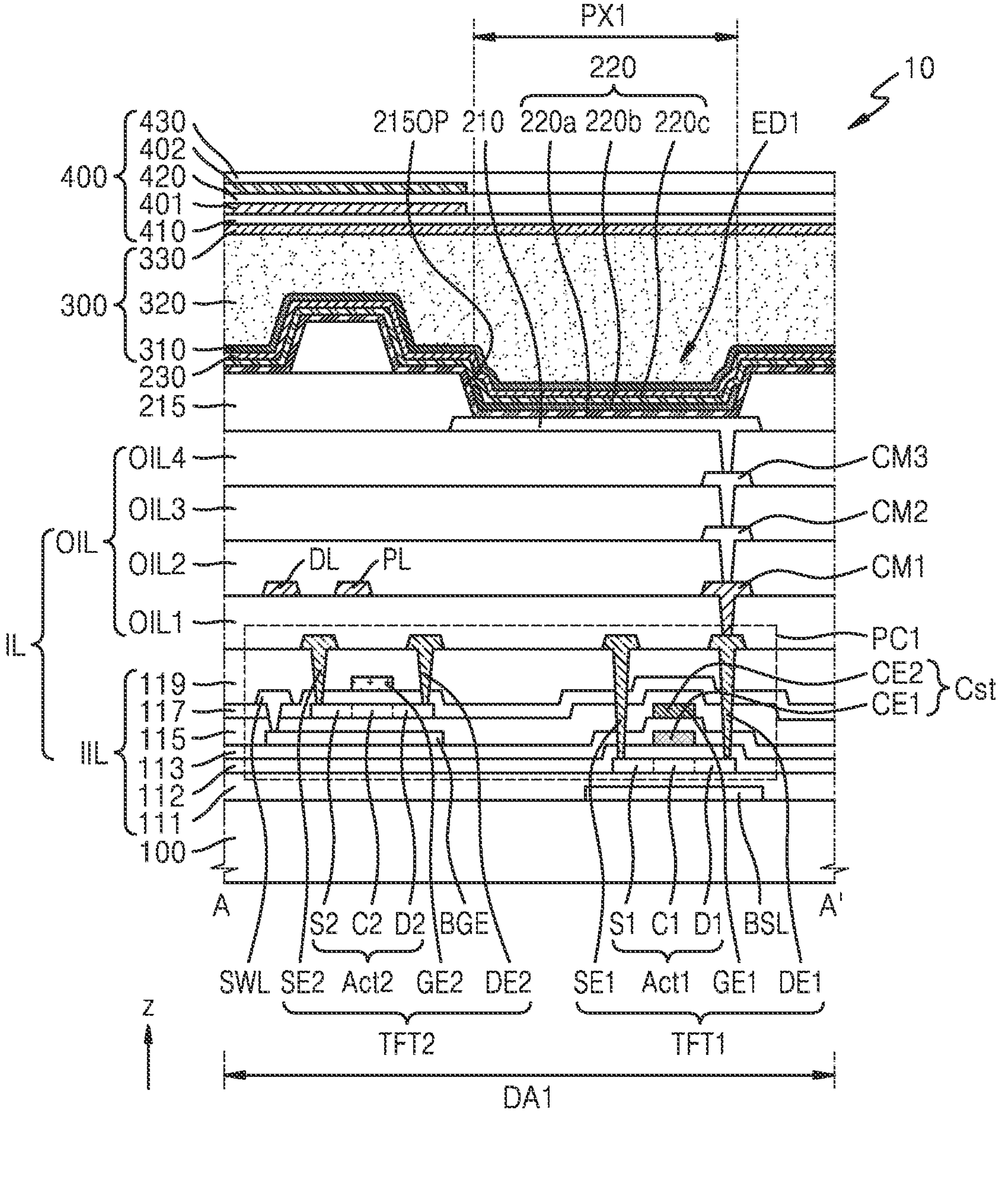
FIG. 5 is a cross-sectional view schematically illustrating a structure of a first display area of a display panel according to some embodiments, taken along the line A-A' of FIG. 3A.

FIG. 5 is a cross-sectional view schematically illustrating a structure of a first display area of a display panel according to some embodiments, taken along the line A-A' of FIG. 3A.

Referring to FIG. 5, the display panel 10 may include the substrate 100, the display portion, the encapsulation layer 300, and the touch sensor layer 400. The display portion may include the insulating layer IL, the first subpixel circuit PC1, the first display device ED1, and a bank layer 215.

The substrate 100 may be glass or may include a polymer resin, such as polyethersulfone, polyarylate, polyether imide, polyethylene naphthalate, polyethylene terephthalate, polyphenylene sulfide, polyimide, polycarbonate, cellulose triacetate, or cellulose acetate propionate. According to some embodiments, the substrate 100 may have a multi-layer structure including a base layer including the aforementioned polymer resin and a barrier layer. The substrate 100 including polymer resin may be flexible, rollable, and bendable.

The insulating layer IL may be arranged on the substrate 100. The insulating layer IL may include an inorganic insulating layer IIL and an organic insulating layer OIL. According to some embodiments, the inorganic insulating layer IIL may include a buffer layer 111, a first gate insulating layer 112, a second gate insulating layer 113, a first interlayer insulating layer 115, a third gate insulating layer 117, and a second interlayer insulating layer 119.

The first subpixel circuit PC1 may be arranged in the first display area DA1. The first subpixel circuit PC1 may include a plurality of transistors and a storage capacitor as described with reference to FIGS. 4A and 4B. In this regard, FIG. 5 illustrates a first thin film transistor TFT1, a second thin film transistor TFT2, and a storage capacitor Cst. The first thin film transistor TFT1 may include a first semiconductor layer Act1, a first gate electrode GE1, a first source electrode SE1, and a first drain electrode DE1. The second thin film transistor TFT2 may include a second semiconductor layer Act2, a second gate electrode GE2, a second source electrode SE2, and a second drain electrode DE2. The storage capacitor Cst may include the first capacitor electrode CE1 and the second capacitor electrode CE2.

The buffer layer 111 may be located on the substrate 100. The buffer layer 111 may reduce or block penetration of foreign substances, moisture, or external air from the bottom of the substrate 100. The buffer layer 111 may include an inorganic material, such as a silicon oxide, a silicon oxynitride, or a silicon nitride, and may have a single or multi-layer structure including the above material.

The first semiconductor layer Act1 may include a silicon semiconductor. The first semiconductor layer Act1 may include polysilicon. The first semiconductor layer Act1 may include amorphous silicon. According to some embodiments, the first semiconductor layer Act1 may include an oxide semiconductor or include an organic semiconductor, etc. The first semiconductor layer Act1 may include a channel area C1 and a drain area D1 and a source area 51 which are respectively arranged at either side of the channel area C1. The first gate electrode GE1 may overlap with the channel area C1.

The first gate electrode GE1 may overlap with the first semiconductor layer Act1. The first gate electrode GE1 may include a low-resistance metal material. The first gate electrode GE1 may include a conductive material including molybdenum (Mo), aluminum (Al), copper (Cu), and/or titanium (Ti) and have a single or a multi-layer structure including the above material.

The first gate insulating layer 112 may be arranged between the first semiconductor layer Act1 and the first gate electrode GE1. Accordingly, the first semiconductor layer Act1 may be insulated from the first gate electrode GE1. The first gate insulating layer 112 may include an inorganic insulating material, such as a silicon oxide, a silicon nitride, a silicon oxynitride, an aluminum oxide, a titanium oxide, a tantalum oxide, a hafnium oxide, and/or a zinc oxide.

The second gate insulating layer 113 may cover the first gate electrode GE1. The second gate insulating layer 113 may be arranged on the first gate electrode GE1. Similar to the first gate insulating layer 112, the second gate insulating layer 113 may include an inorganic insulating material, such as a silicon oxide, a silicon nitride, a silicon oxynitride, an aluminum oxide, a titanium oxide, an tantalum oxide, a hafnium oxide, and/or a zinc oxide.

The second capacitor electrode CE2 may be arranged on the second gate insulating layer 113. The second capacitor electrode CE2 may overlap with the first gate electrode GE1 thereunder. In this case, the second capacitor electrode CE2 and the first gate electrode GE1 may overlap with each other, with the second gate insulating layer 113 therebetween and form the storage capacitor Cst. That is, the first gate electrode GE1 of the first thin film transistor TFT1 may function as the first capacitor electrode CE1 of the storage capacitor Cst.

As such, the storage capacitor Cst and the first thin film transistor TFT1 may overlap one another. According to some embodiments, the storage capacitor Cst may not overlap with the first thin film transistor TFT1.

The second capacitor electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above-described material.

The first interlayer insulating layer 115 may cover the second capacitor electrode CE2. According to some embodiments, the first interlayer insulating layer 115 may cover the first gate electrode GE1. The first interlayer insulating layer 115 may include a silicon oxide, a silicon nitride, a silicon oxynitride, an aluminum oxide, a titanium oxide, a tantalum oxide, a hafnium oxide, or a zinc oxide. The first interlayer insulating layer 115 may have a single or multi-layer structure including the aforementioned inorganic insulating material.

The second semiconductor layer Act2 may be arranged on the first interlayer insulating layer 115. According to some embodiments, the second semiconductor layer Act2 may include a channel area C2 and a source area S2 and a drain area D2 which are respectively arranged at either side of the channel area C2. The second semiconductor layer Act2 may include an oxide semiconductor. For example, the semiconductor layer Act2 may include a Zn oxide-based material such as a Zn oxide, an In—Zn oxide, a Ga—In—Zn oxide, etc. Alternatively, the second semiconductor layer Act2 may include In—Ga—Zn—O (IGZO), In—Sn—Zn—O (ITZO), or In—Ga—Sn—Zn—O (IGTZO) semiconductor, in which a metal such as indium (In), gallium (Ga), or stannum (Sn) is included in zinc oxide (ZnO).

The source area S2 and the drain area D2 of the second semiconductor layer Act2 may be formed by adjusting carrier concentration of an oxide semiconductor and making the source area S2 and the drain area D2 conductive. For example, the source area S2 and the drain area D2 of the second semiconductor layer Act2 may be formed by increasing the carrier concentration through plasma processing performed on an oxide semiconductor by using a hydrogen-based gas, a fluorine-based gas, or a combination thereof.

The third gate insulating layer 117 may cover the second semiconductor layer Act2. The third gate insulating layer 117 may be arranged between the second semiconductor layer Act2 and the second gate electrode GE2. According to some embodiments, the third gate insulating layer 117 may be arranged entirely on the substrate 100. According to some embodiments, the third gate insulating layer 117 may be patterned according to the shape of the second gate electrode GE2. The third gate insulating layer 117 may include a silicon oxide, a silicon nitride, a silicon oxynitride, an aluminum oxide, a titanium oxide, a tantalum oxide, a hafnium oxide, or a zinc oxide. The third gate insulating layer 117 may have a single or multi-layer structure including the aforementioned inorganic insulating material.

The second gate electrode GE2 may be arranged on the third gate insulating layer 117. The second gate electrode GE2 may overlap with the second semiconductor layer Act2. The second gate electrode GE2 may overlap with the channel area C2 of the second semiconductor layer Act2. The second gate electrode GE2 may include a conductive material including molybdenum (Mo), aluminum (Al), copper (Cu), and/or titanium (Ti) and have a single or a multi-layer structure including the above material.

The second interlayer insulating layer 119 may cover the second gate electrode GE2. The second interlayer insulating layer 119 may include a silicon oxide, a silicon nitride, a silicon oxynitride, an aluminum oxide, a titanium oxide, a tantalum oxide, a hafnium oxide, or a zinc oxide. The second interlayer insulating layer 119 may have a single or multi-layer structure including the aforementioned inorganic insulating material.

The first source electrode SE1 and the first drain electrode DE1 may be arranged on the second interlayer insulating layer 119. The first source electrode SE1 and the first drain electrode DE1 may be connected with the first semiconductor layer Act1. The first source electrode SE1 and the first drain electrode DE1 may be connected with the first semiconductor layer Act1 through contact holes of the insulating layers.

The second source electrode SE2 and the second drain electrode DE2 may be arranged on the second interlayer insulating layer 119. The second source electrode SE2 and the second drain electrode DE2 may be electrically connected to the second semiconductor layer Act2. The second source electrode SE2 and the second drain electrode DE2 may be electrically connected to the second semiconductor layer Act2 through the contact holes of the insulating layers.

The first source electrode SE1, the first drain electrode DE1, the second source electrode SE2, and the second drain electrode DE2 may include a material having high conductivity. The first source electrode SE1, the first drain electrode DE1, the second source electrode SE2, and the second drain electrode DE2 may include a conductive material including molybdenum (Mo), aluminum (Al), copper (Cu), titanium (Ti), etc., and may have a single or multi-layer structure including the foregoing material. According to some embodiments, the first source electrode SE1, the first drain electrode DE1, the second source electrode SE2, and the second drain electrode DE2 may have a Ti/Al/Ti multi-layer structure.

The first thin film transistor TFT1 including the first semiconductor layer Act1 including a silicon semiconductor may have a high reliability. For example, the first thin film transistor TFT1 may be the driving transistor T1 (FIG. 4B). In this case, the display panel 10 having high quality may be implemented.

In addition, as an oxide semiconductor has a high carrier mobility and a low leakage current, a voltage drop may not be large even though a driving time is long. That is, even during a low-frequency driving, a color change of an image depending on a voltage drop is not large and thus a display device may be driven at low frequencies. As an oxide semiconductor may have relatively less leakage current, by employing an oxide semiconductor in at least one of transistors except for the driving transistor, not only the leakage current may be prevented, but also the power consumption may be reduced. For example, the second thin film transistor TFT2 may be the compensation transistor T3 (FIG. 4B).

A lower gate electrode BGE may be arranged under the second semiconductor layer Act2. According to some embodiments, the lower gate electrode BGE may be arranged between the second gate insulating layer 113 and the first interlayer insulating layer 115. According to some embodiments, the lower gate electrode BGE may receive a gate signal. In this case, the second thin film transistor TFT2 may have a gate electrode structure in which gate electrodes are arranged on and under the second semiconductor layer Act2.

According to some embodiments, a sub-wire SWL may be arranged between the third gate insulating layer 117 and the second interlayer insulating layer 119. According to some embodiments, the sub-wire SWL may be electrically connected with the lower gate electrode BGE through a contact hole provided at the first interlayer insulating layer 115 and the third gate insulating layer 117.

According to some embodiments, a bottom metal layer BML may be arranged between the substrate 100 and the first subpixel circuit PC1 overlapping with the first display area DA1. According to some embodiments, the bottom metal layer BML may overlap with the first thin film transistor TFT1. A constant voltage may be applied to the bottom metal layer BML. As the bottom metal layer BML is arranged under the first thin film transistor TFT1, the first thin film transistor TFT1 may be less affected by peripheral interference signals and thus, the reliability of the first thin film transistor TFT1 may be increased.

The organic insulating layer OIL may be arranged on the inorganic insulating layer IIL. The organic insulating layer OIL may include a first organic insulating layer OIL1, a second organic insulating layer OIL2, a third organic insulating layer OIL3, and a fourth organic insulating layer OIL4. However, the disclosure is not limited thereto. The organic insulating layer OIL may include the first organic insulating layer OIL1 and the second organic insulating layer OIL2, or may include the first organic insulating layer OIL1, the second organic insulating layer OIL2, and the third organic insulating layer OIL3. That is, the organic insulating layer OIL may include two or three layers, instead of four layers.

The first organic insulating layer OIL1 may cover the first source electrode SE1, the first drain electrode DE1, the second source electrode SE2, and the second drain electrode DE2. The first organic insulating layer OIL1 may include an organic material. For example, the first organic insulating layer OIL1 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

A first connection electrode CM1, the data line DL, and the driving voltage line PL may be arranged on the first organic insulating layer OIL1. The first connection electrode CM1 may be connected to the first drain electrode DE1 or the first source electrode SE1 through a contact hole of the first organic insulating layer OIL1.

The first connection electrode CM1, the data line DL, and the driving voltage line PL may include a material having high conductivity. The first connection electrode CM1 may include a conductive material including molybdenum (Mo), aluminum (Al), copper (Cu), titanium (Ti), etc. and may have a single or multi-structure including the aforementioned material. For example, the first connection electrode CM1, the data line DL, and the driving voltage line PL may have a Ti/Al/Ti multi-layer structure.

Although FIG. 5 illustrates that the data line DL and the driving voltage line PL are arranged on the same layer (e.g., the first organic insulating layer OIL1), according to some embodiments, the data line DL and the driving voltage line PL may be arranged on different layers from each other.

The second organic insulating layer OIL2 may cover the first connection electrode CM1, the data line DL, and the driving voltage line PL. The second organic insulating layer OIL2 may include an organic insulating layer such as acryl, benzocyclobutene (BCB), polyimide, or hexamethyldisiloxane (HMDSO).

A second connection electrode CM2 may be arranged on the second organic insulating layer OIL2. The second connection electrode CM2 may be electrically connected to the first connection electrode CM1 through a contact hole defined on the second organic insulating layer OIL2.

The second connection electrode CM2 may include a material having high conductivity. The second connection electrode CM2 may include a conductive material including, for example, molybdenum (Mo), aluminum (al), copper (Cu), titanium (Ti), etc. Alternatively, the second connection electrode CM2 may include a transparent conductive material, for example, transparent conducting oxide (TCO). The second connection electrode CM2 may have a single or multi-layer structure including the aforementioned material. According to some embodiments, the second connection electrode CM2 may have a Ti/Al/Ti multi-layer structure.

The third organic insulating layer OIL3 may cover the second connection electrode CM2. The third organic insulating layer OIL3 may include an organic material. According to some embodiments, the third organic insulating layer OIL3 may include an organic insulating layer such as acryl, benzocyclobutene (BCB), polyimide, or hexamethyldisiloxane (HMDSO).

A third connection electrode CM3 may be arranged on the third organic insulating layer OIL3. The third connection electrode CM3 may be electrically connected to the second connection electrode CM2 through a contact hole defined in the third organic insulating layer OIL3.

The third connection electrode CM3 may include a material having high conductivity. The third connection electrode CM3 may include a conductive material including molybdenum (Mo), aluminum (al), copper (Cu), titanium (Ti), etc. Alternatively, the third connection electrode CM3 may include a transparent conductive material, for example, TCO. The third connection electrode CM3 may have a single or multi-layer structure including the aforementioned material. According to some embodiments, the third connection electrode CM3 may have a Ti/Al/Ti multi-layer structure.

The fourth organic insulating layer OIL4 may include an organic material. According to some embodiments, the fourth organic insulating layer OIL4 may include an organic insulating layer such as acryl, benzocyclobutene (BCB), polyimide, or hexamethyldisiloxane (HMDSO).

The first display device ED1 located in the first display area DA1 may be arranged on the organic insulating layer OIL. The first display device ED1 may be an organic light-emitting diode. For example, the first display device ED1 may be arranged on the fourth organic insulating layer OIL4.

The first display device ED1 may be electrically connected to the first subpixel circuit PC1. In the first display area DA1, the first display device ED1 may be electrically connected to the first subpixel circuit PC1 to implement the first subpixel PX1. According to some embodiments, the first display device ED1 may overlap with the first subpixel circuit PC1. The first display device ED1 may be an organic light-emitting diode, and may include a subpixel electrode 210, an intermediate layer 220, and an opposite electrode 230.

The subpixel electrode 210 may be arranged on the fourth organic insulating layer OIL4. The subpixel electrode 210 may be electrically connected to the third connection electrode CM3 through a contact hole defined in the fourth organic insulating layer OIL4.

The subpixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. Alternatively, the subpixel electrode 210 may further include a conductive oxide layer on and/or under the reflective film. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). According to some embodiments, the subpixel electrode 210 may include an ITO/Ag/ITO triple-layer structure.

The bank layer 215 may be arranged on the subpixel electrode 210. An opening 2150P exposing at least a part of the subpixel electrode 210 may be defined in the bank layer 215. A center portion of the subpixel electrode 210 may be exposed through the opening 2150P defined in the bank layer 215. The opening 2150P may define an emission area of light emitted from the first display device ED1.

The bank layer 215 may include an organic insulating material. According to some embodiments, the bank layer 215 may include an inorganic insulating material such as a silicon nitride, a silicon oxynitride, or a silicon oxide. According to some embodiments, the bank layer 215 may include an organic insulating material or an inorganic insulating material. According to some embodiments, the bank layer 215 may include a light-blocking material and may be black. The light-blocking material may include carbon black, carbon nanotube, resin or paste including black dyes, metal particles, for example, nickel, aluminum, molybdenum, and an alloy thereof, metal oxide particles (e.g., chrome oxide), or metal nitride particles (e.g., chrome nitride), etc. When the bank layer 215 includes a light-blocking material, the reflection of external light by metal structures arranged under the bank layer 215 may be reduced.

A spacer 217 may be arranged on the bank layer 215. The spacer 217 may be formed by the same process as used to form the bank layer 215 or the spacer 217 and the bank layer 215 may be formed by each separate process. According to some embodiments, the spacer 217 may include an organic insulating material such as polyimide.

An intermediate layer 222 may include an emission layer 222*b*. The intermediate layer 222 may include a first common layer 222*a* arranged under the emission layer 222*b* and/or a second common layer 222*c* arranged on the emission layer 222*b*. The emission layer 222*b* may include a polymer or a low-molecular organic material that emits light of certain color (red, green, or blue). According to some embodiments, the emission layer 222*b* may include an inorganic material or quantum dots.

The second common layer 222*c* may include an electron transport layer (ETL) and/or an electron injection layer (EIL). The first common layer 222*a* and the second common layer 222*c* may include an organic material.

The emission layer 222*b* may be arranged in the first display area DA1 to overlap with the subpixel electrode 210 through the opening 2150P of the bank layer 215. On the contrary, an organic material layer included in the intermediate layer 222, for example, the first common layer 222*a* and the second common layer 222*c* may entirely cover the first display area DA1.

The intermediate layer 222 may have a single-stack structure including a single emission layer or a tandem structure, which is a multi-stack structure including multiple emission layers. When the intermediate layer 222 has a tandem structure, a charge generation layer (CGL) may be arranged between the multiple stacks. The opposite electrode 230 may be arranged on the intermediate layer 222.

The opposite electrode 230 may include a conductive material having a low work function. For example, the opposite electrode 230 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 230 may further include a layer including ITO, IZO, ZnO, or $In_2O_3$ on the (translucent) transparent layer including the aforementioned materials. According to some embodiments, the opposite electrode 230 may entirely cover the first display area DA1.

The first display device ED1 may be covered with the encapsulation layer 300. The encapsulation layer 300 may include at least one organic encapsulation layer and at least one inorganic encapsulation layer. According to some embodiments, FIG. illustrates that the encapsulation layer 300 includes a first inorganic encapsulation layer 310, a second inorganic encapsulation layer 330, and the organic encapsulation layer 320 arranged therebetween.

The first inorganic encapsulation layer 310 and the second inorganic encapsulation layer 330 may include at least one inorganic material from an aluminum oxide, a titanium oxide, a tantalum oxide, a hafnium oxide, a zinc oxide, a silicon oxide, a silicon nitride, and a silicon oxynitride. The first inorganic encapsulation layer 310 and the second inorganic encapsulation layer 330 may include a single layer or a multiple layer including the above material. The organic encapsulation layer 320 may include a polymer-based material. Examples of the polymer-based material may include an acrylic resin, an epoxy resin, polyimide, and polyethylene. According to some embodiments, the organic encapsulation layer 320 may include acrylate.

The touch sensor layer 400 may be arranged on the encapsulation layer 300. The touch sensor layer 400 may include a first touch insulating layer 410, a first touch conductive layer 401, a second touch insulating layer 420, a second touch conductive layer 402, and a planarization layer 430.

The first touch insulating layer 410 may protect the encapsulation layer 300 and may prevent or reduce generation of crack in at least one of, for example, the first inorganic encapsulation layer 310 and/or the second inorganic encapsulation layer 330. The first touch insulating layer 410 may include an inorganic insulating layer. The first touch insulating layer 410 may include, for example, an aluminum oxide, a titanium oxide, a tantalum oxide, a hafnium oxide, a zinc oxide, a silicon oxide, a silicon nitride, and/or a silicon oxynitride. The first touch insulating layer 410 may have a single or multi-layer structure including the aforementioned inorganic insulating material. According to some embodiments, the first touch insulating layer 410 may be omitted.

The first touch conductive layer 401 may be arranged on the first touch insulating layer 410. The first touch conductive layer 401 may include a conductive material. The first touch conductive layer 401 may include at least one of, for example, molybdenum (Mo), aluminum (Al), copper (Cu), or titanium (Ti). According to some embodiments, the first touch conductive layer 401 may have a Ti/Al/Ti multi-layer structure.

The second touch insulating layer 420 may cover the first touch conductive layer 401. The second touch insulating layer 420 may include an inorganic insulating material and/or an organic insulating material. The inorganic insulating material may include a silicon oxide, a silicon nitride, and/or a silicon oxynitride, etc., and the organic insulating material may include an acryl-based or imide-based organic material.

The second touch conductive layer 402 may be arranged on the second touch insulating layer 420. The second touch insulating layer 420 may include a contact hole, and through the contact hole, the second touch conductive layer 402 may be electrically connected to the first touch conductive layer 401. The second touch conductive layer 402 may include a conductive material. The second touch conductive layer 402 may include at least one of, for example, molybdenum (Mo), aluminum (Al), copper (Cu), or titanium (Ti). According to some embodiments, the second touch conductive layer 402 may have a Ti/Al/Ti multi-layer structure.

The planarization layer 430 may cover the second touch conductive layer 402. A top surface of the planarization layer 430 may be flat. The planarization layer 430 may include an organic material. According to some embodiments, the planarization layer 430 may include a polymer-based material. The polymer-based material may be transparent. For example, the planarization layer 430 may include silicon-based resin, acryl-based resin, epoxy-based resin, polyimide, polyethylene, etc. The planarization layer 430 may include an inorganic material.

Figure 6:
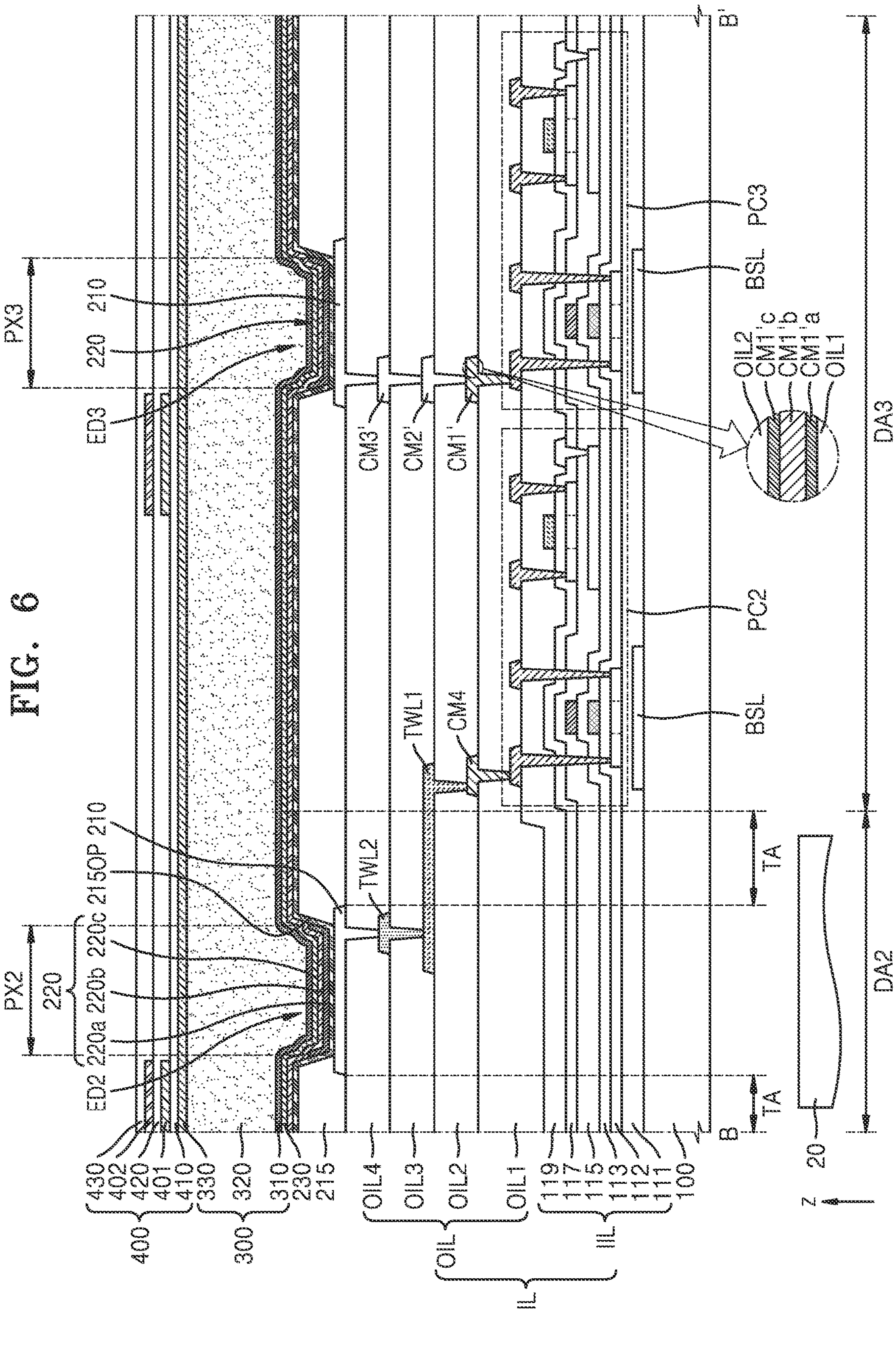
FIG. 6 is a cross-sectional view schematically illustrating a second display area and a third display area of a display panel according to some embodiments, taken along the line B-B' of FIG. 3A.

FIG. 6 is a cross-sectional view schematically illustrating a second display area and a third display area of a display panel according to some embodiments, taken along the line B-B' of FIG. 3A.

Referring to FIG. 6, the second display device ED2 corresponding to the second subpixel PX2 may be arranged in the second display area DA2. The second display device ED2 may include the subpixel electrode 210 of which edge is covered with the bank layer 215, the emission layer 222*b* overlapping with the subpixel electrode 210 through the opening 2150P of the bank layer 215, and the opposite electrode 230 on the emission layer 222*b*. A first common layer 220*a* and a second common layer 220*c* may be arranged between the subpixel electrode 210 and the opposite electrode 230 as described above.

The second subpixel circuit PC2 for driving the second display device ED2 may be arranged in the third display area DA3. The second subpixel circuit PC2 may have the same structure as the first subpixel circuit PC1 (FIG. 5) described with reference to FIG. 5.

The second subpixel circuit PC2 and the second display device ED2 may be electrically connected to each other by the connection wire extending from the third display area DA3 to the second display area DA2. There may be a plurality of connection wires. The plurality of connection wires may each be electrically connected to the second subpixel circuits PC2. The plurality of connection wires may respectively connect the plurality of second display devices ED2 to the plurality of second subpixel circuits PC2. According to some embodiments, the connection wire may include a first connection wire TWL1 and a second connection wire TWL2.

FIG. 6 illustrates that the second subpixel circuit PC2 and the second display device ED2 are electrically connected to each other by the first connection wire TWL1 extending from the third display area DA3 to the second display area DA2. For example, the first connection wire TWL1 may be connected to the second subpixel circuit PC2 through a fourth connection electrode CM4 in the third display area DA3. The first connection wire TWL1 may be electrically connected to the subpixel electrode 210 of the second display device ED2 through the second connection wire TWL2 in the second display area DA2. Although the drawings illustrate that the first connection wire TWL1 is arranged on the second organic insulating layer OIL2, and the second connection wire TWL2 is arranged on the third organic insulating layer OIL3, according to some embodiments, the first connection wire TWL1 may be arranged under the second organic insulating layer OIL2, for example, on the first organic insulating layer OIL1. In addition, the second connection wire TWL2 may be arranged under the third organic insulating layer OIL3, for example, on the second organic insulating layer OIL2. The fourth connection electrode CM4 may include a conductive material including molybdenum (Mo), aluminum (Al), copper (Cu), titanium (Ti), etc. and may have a single or multi-structure including the aforementioned material. For example, the fourth connection electrode CM4 may have a Ti/Al/Ti multi-layer structure.

Each of the first connection wire TWL1 and the second connection wire TWL2 may include a transparent conductive material, for example, TCO. The first connection wire TWL1 and the second connection wire TWL2 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The third display device ED3 corresponding to the third subpixel PX3 may be arranged in the third display area DA3. The third display device ED3 may include the subpixel electrode 210 of which edge is covered with the bank layer 215, the emission layer 222*b* overlapping with the subpixel electrode 210 through the opening 2150P of the bank layer 215, and the opposite electrode 230 on the emission layer 222*b*.

The third subpixel circuit PC3 for operation of the third display device ED3 may be arranged in the third display area DA3 of the substrate 100, and the third subpixel circuit PC3 may be electrically connected to the third display device ED3. The third subpixel circuit PC3 may have the same structure as the first subpixel circuit PC1 (FIG. 5) described with reference to FIG. 5.

The third subpixel circuit PC3 may be electrically connected to the third display device ED3 through a fifth connection electrode CM1', a sixth connection electrode CM2', and a seventh connection electrode CM3'. The fifth connection electrode CM1' may be arranged on the same layer as the fourth connection electrode CM4 (e.g., the first organic insulating layer OIL1) and include the same material as the fourth connection electrode CM4. The sixth connection electrode CM2' may be arranged on the same layer as the first connection wire TWL1 (e.g., the second organic insulating layer OIL2) and include the same material as the first connection wire TWL1. The seventh connection electrode CM3' may be arranged on the same layer as the second connection wire TWL2 (e.g., the third organic insulating layer OIL3) and include the same material as the second connection wire TWL2.

The fifth connection electrode CM1' may include the same material as the first connection electrode CM1 (FIG. 5) illustrated in FIG. 5. The fifth connection electrode CM1' may include a conductive material including molybdenum (Mo), aluminum (Al), copper (Cu), titanium (Ti), etc. and may have a single or multi-structure including the aforementioned material. According to some embodiments, the fifth connection electrode CM1' may have a Ti/Al/Ti triple-layer structure including a first layer CM1'*a*, a second layer CM1'*b*, and a third layer CM1'*c*.

The encapsulation layer 300 and the touch sensor layer 400 may be arranged on the second display device ED2 and the third display device ED3, and the structures thereof are as described above with reference to FIG. 5.

Figure 7:
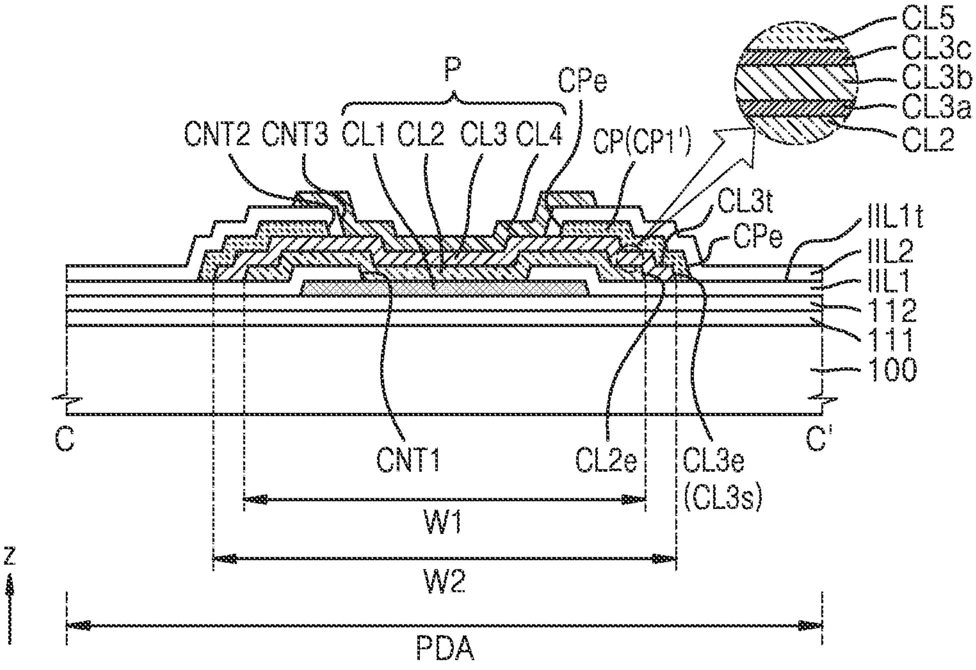
FIG. 7 is a cross-sectional view schematically illustrating a pad area of a display panel according to some embodiments, taken along the line C-C' of FIG. 3A.

FIG. 7 is a cross-sectional view schematically illustrating a pad area of a display panel according to some embodiments, taken along the line C-C' of FIG. 3A.

Referring to FIGS. 3A and 7, the pad portion PD may be arranged in the pad area PDA. The pad portion PD may include a plurality of pads P. The buffer layer 111 and the first gate insulating layer 112 which extend from the display area DA may be arranged between the pad P and the substrate 100.

Each pad P may include a first conductive layer CL1, a second conductive layer CL2, a third conductive layer CL3, and a fourth conductive layer CL4. The first conductive layer CL1, the second conductive layer CL2, the third conductive layer CL3, and the fourth conductive layer CL4 may be sequentially stacked and be electrically connected to each other. The first conductive layer CL1 may include the same material as the first gate electrode GE1 (FIG. 5) of the first thin film transistor TFT1 (FIG. 5) illustrated in FIG. 5. According to some embodiments, the first conductive layer CL1 may include the same material as the second capacitor electrode CE2 (FIG. 5) of the storage capacitor Cst (FIG. 5). The first conductive layer CL1 may be electrically connected to the display portion through a connection member arranged on the same layer. The connection member and the first conductive layer CL1 may be arranged on different layers from each other.

The second conductive layer CL2 may be arranged on the first conductive layer CL1, and a first inorganic insulating layer IIL1 may be arranged between the first conductive layer CL1 and the second conductive layer CL2. The first conductive layer CL1 and the second conductive layer CL2 may be electrically connected to each other through a first contact hole CNT1 defined in the first inorganic insulating layer IIL1. According to some embodiments, the second conductive layer CL2 may include the same material as the first thin film transistor TFT1 (FIG. 5), the first source electrode SE1 (FIG. 5), and the first drain electrode DE1 (FIG. 5). In addition, according to some embodiments, the first inorganic insulating layer IIL1 may include the same material as the first interlayer insulating layer 105 (FIG. 5), the second gate insulating layer 113 (FIG. 5), or the second interlayer insulating layer 119 (FIG. 5) in the display area DA. The third conductive layer CL3 may be arranged on the second conductive layer CL2. The third conductive layer CL3 may entirely cover the second conductive layer CL2. In other words, a second width W2 of the third conductive layer CL3 may be greater than a first width W1 of the second conductive layer CL2 such that the third conductive layer CL3 covers an edge CL2*e* of the second conductive layer CL2. According to some embodiments, the third conductive layer CL3 may include the same material as the first connection electrode CM1 (FIG. 5) and the fifth connection electrode CM1' (FIG. 6). For example, the third conductive layer CL3 may have a triple-layer structure including a first layer CL3*a*, a second layer CL3*b*, and a third layer CL3*c*.

A cover layer CP may be arranged on the third conductive layer CL3, and cover an edge CL3*e* of the third conductive layer CL3. The cover layer CP may not entirely cover the third conductive layer CL3 and include a second contact hole CNT2 exposing a center portion of the third conductive layer CL3.

The cover layer CP may sequentially cover a top surface CL3*t* of the third conductive layer CL3, a side surface CL3*s* corresponding to the edge CL3*e* of the third conductive layer CL3, and at least a part of a top surface IIL1*t* of the first inorganic insulating layer IIL1 under the third conductive layer CL3. The side surface CL3*s* of the third conductive layer CL3 may correspond to the edge CL3*e* of the third conductive layer CL3. For example, the cover layer CP may sequentially cover a side surface of the third layer CL3*c* of the third conductive layer CL3, a side surface of the second layer CL3*b*, a side surface of the first layer CL3*a*, at least a part of a top surface of the third layer CL3*c*, and at least a part of the top surface IIL1*t* of the first inorganic insulating layer IIL1.

The cover layer CP may extend to cover the top surface CL3*t* of the third conductive layer CL3, the side surface CL3*s* of the third conductive layer CL3, and the top surface IIL1*t* of the first inorganic insulating layer IIL1.

The cover layer CP may be in direct contact with the top surface CL3*t* of the third conductive layer CL3, the side surface CL3*s* of the third conductive layer CL3, and the top surface IIL1*t* of the first inorganic insulating layer IIL1.

As the cover layer CP covers the edge CL3*e* of the third conductive layer CL3, among the first layer CL3*a*, and the second layer CL3*b*, and the third layer CL3*c* of the third conductive layer CL3 having the Ti/Al/Ti triple-layer structure, the second layer CL3*b* which does not include aluminum (Al) may not be exposed to the outside.

In a subsequent mask process, when the edge CL3*e* of the third conductive layer CL3 is not covered and exposed to an etchant for a long time, an undercut may be generated at the side surface of the second layer CL3*b*, and relatively, a protruding tip structure may be excessively formed at the side surface of the third layer CL3*c*. When such protruding tip structure is formed, a gap may be generated at the side surface CL3*s* of the third conductive layer CL3, and the gap may become a flow path of water and oxygen. In addition, the tip structure of the third layer CL3*c* may generate a crack and form a moisture movement path.

According to some embodiments, as the cover layer CP covers the edge of the third conductive layer CL3, generation of undercut or protruding tip structure at the edge of the third conductive layer CL3 may be prevented or minimized.

According to some embodiments, the cover layer CP may include at least one transparent conductive material layer. Although FIG. 7 illustrates that the cover layer CP includes one transparent conductive material CP1', the disclosure is not limited thereto. According to some embodiments, the cover layer CP may include a plurality of transparent conductive material layers as described below with reference to FIG. 8.

When the cover layer CP includes one transparent conductive material layer CP1', the transparent conductive material layer CP1' may include the same material as the first connection wire TWL1 illustrated in FIG. 6, and may be formed by the same process as the first connection wire TWL1. The transparent conductive material layer CP1' may include, for example, TCO. The transparent conductive material layer CP1' may include at least one of indium tin oxide (ITO), indium zinc oxide (IZO), zinc oxide (ZnO), indium oxide ($In_2O_3$), indium gallium oxide (IGO), or aluminum zinc oxide (AZO).

In a comparative example, when a cover layer includes, for example, an organic insulating layer such as the second organic insulating layer OIL2 (FIG. 5), the adhesion between the cover layer and the first inorganic insulating layer may not be strong enough, and thus, a slip or layer separation may occur when an external force is applied to a pad. Moreover, even though the cover layer has a thick thickness, as it is easily deformed, a crack may be easily generated at the second inorganic insulating layer arranged on the cover layer. Accordingly, the reliability of the device may be degraded.

However, according to some embodiments of the disclosure, as the cover layer CP includes the transparent conductive material layer CP1', the layer separation between the cover layer CP and the first inorganic insulating layer IIL1 may be prevented. As the transparent conductive material layer CP1' has a relatively thin thickness and a great resistance against deformation, the step of the second inorganic insulating layer IIL2 thereon may be diminished, and the risk of crack generation due to an external force may be reduced. Accordingly, the reliability of the device may be increased.

Moreover, by forming the transparent conductive material layer CP1' constituting the cover layer CP in the process of forming the first connection wire TW1 (FIG. 6), the cover layer CP effectively covering the edge CL3*e* of the third conductive layer CL3 may be formed without a separate process. As such, there may be an economic advantage in the manufacturing process.

The second inorganic insulating layer IIL2 may be arranged on the cover layer CP. The second inorganic insulating layer IIL2 may entirely cover the cover layer CP. The second inorganic insulating layer IIL2 may cover an edge CPe of the cover layer CP. The second inorganic insulating layer IIL2 may cover a top surface of the cover layer CP and include a third contact hole CNT3 exposing a part of the third conductive layer CL3 exposed through the second contact hole CNT2.

According to some embodiments, the second inorganic insulating layer IIL2 may include the same material as the first touch insulating layer 410 (FIG. 5) of the touch sensor layer 400 (FIG. 5) described with reference to FIG. 5. However, the disclosure is not limited thereto, and any inorganic insulating layer formed on the third conductive layer CL3 in the process of forming the second inorganic insulating layer IIL2 may be enough.

The fourth conductive layer CL4 may be arranged on the second inorganic insulating layer IIL2 and may be in contact with the third conductive layer CL3 through the third contact hole CNT3. The fourth conductive layer CL4 may be a final exposed portion of the pad P and may be electrically connected to the pad portion PCB-P of the printed circuit board PCB illustrated in FIG. 3A or 3B. According to some embodiments, the fourth conductive layer CL4 may include the same material as the second touch conductive layer 402 of the touch sensor layer 400 illustrated in FIG. 5. However, the disclosure is not limited thereto, and the fourth conductive layer CL4 may include the same material as the first touch conductive layer 401 (FIG. 5).

Figure 8:
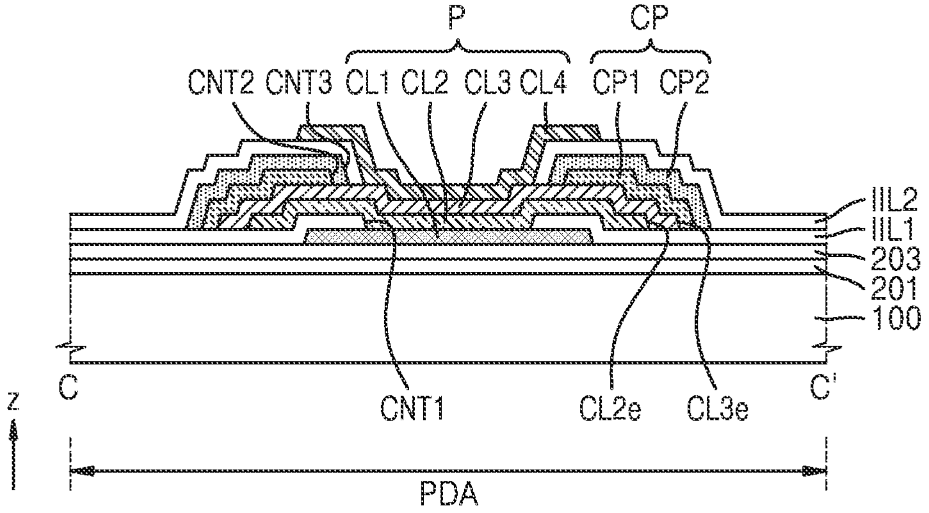
FIG. 8 is a cross-sectional view schematically illustrating a pad area of a display panel according to some embodiments.

FIG. 8 is a cross-sectional view schematically illustrating a pad area of a display panel according to some embodiments. FIG. 8 is a variation example of FIG. 7, and thus, any redundant description may be omitted.

Referring to FIG. 8, the cover layer CP may include a plurality of transparent conductive material layers. For example, the cover layer CP may include a first transparent conductive material layer CP1 and a second transparent conductive material layer CP2 which are sequentially stacked. According to some embodiments, the second transparent conductive material layer CP2 may cover the first transparent conductive material layer CP1.

Each of the first and second transparent conductive material layers CP1 and CP2 may include at least one of indium tin oxide (ITO), indium zinc oxide (IZO), zinc oxide (ZnO), indium oxide ($In_2O_3$), indium gallium oxide (IGO), or aluminum zinc oxide (AZO).

At least one transparent conductive material layer included in the cover layer CP may include the same material as the first connection wire TWL1 (FIG. 6) and the second connection wire TWL2 (FIG. 6) described with reference to FIG. 6. According to some embodiments, the first transparent conductive material layer CP1 may include the same material as the first connection wire TWL1 (FIG. 6) and may be formed by the same process as the first connection wire TWL1. The second transparent conductive material layer CP2 may include the same material as the second connection wire TWL2 (FIG. 6) and may be formed by the same process as the second connection wire TWL2.

According to some embodiments, the by forming the first and second transparent conductive material layers CP1 and CP2 of the cover layer CP in the process of forming the first and second connection wires TWL1 and TWL2 (FIG. 6), the cover layer CP effectively covering the edge CL3*e* of the third conductive layer CL3 may be formed without a separate process, which leads to economic advantages in the manufacturing process. In addition, when the cover layer CP includes the first transparent conductive material layer CP1 and the second transparent conductive material layer CP2 which are sequentially stacked, the step coverage of the edge CL3*e* of the third conductive layer CL3 may be better, compared to the case where the cover layer CP includes one transparent conductive material layer.

According to some embodiments as described above, a display panel with improved reliability in a pad area and an electronic device including the display panel may be implemented. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:

a substrate including a display area, a non-display area outside the display area, and a pad area in the non-display area;

a display portion arranged in the display area and including a subpixel; and a pad portion arranged in the pad area and including a pad, wherein the pad comprises:

a first conductive layer on the substrate;

a first inorganic insulating layer covering the first conductive layer and including a first contact hole exposing at least a part of the first conductive layer;

a second conductive layer on the first inorganic insulating layer and in contact with the first conductive layer through the first contact hole; and a third conductive layer covering the second conductive layer, an edge of the third conductive layer is covered with at least one transparent conductive material layer, and the at least one transparent conductive material layer contacts the first inorganic insulating layer, wherein, in a direction parallel to a plane of a top surface of the substrate, the third conductive layer is between the second conductive layer and the at least one transparent conductive material layer.

2. The display panel of claim 1, further comprising:

a second inorganic insulating layer covering the at least one transparent conductive material layer and including a second contact hole exposing at least a part of the third conductive layer; and a fourth conductive layer on the second inorganic insulating layer and in contact with the third conductive layer through the second contact hole.

3. The display panel of claim 2, further comprising:

a thin film encapsulation layer arranged on the display portion and including at least one organic encapsulation layer and at least one inorganic encapsulation layer; and a touch sensor layer on the thin film encapsulation layer, wherein the touch sensor layer comprises:

a first touch insulating layer;

a first touch electrode layer on the first touch insulating layer;

a second touch insulating layer on the first touch electrode layer; and a second touch electrode layer on the second touch insulating layer, and the fourth conductive layer includes a same material as the second touch electrode layer.

4. The display panel of claim 1, wherein the third conductive layer has a triple-layer structure including a first layer, a third layer, and a second layer between the first layer and the third layer, which include a same material.

5. The display panel of claim 4, wherein the first layer and the third layer of the third conductive layer include titanium, and the second layer of the third conductive layer includes aluminum.

6. The display panel of claim 1, wherein the display area includes a first display area and a second display area at least partially surrounded by the first display area, the display panel comprises:

a plurality of first display devices in the first display area;

a plurality of second display devices in the second display area;

a plurality of second subpixel circuits respectively and electrically connected with the plurality of second display devices; and a plurality of connection wires respectively and electrically connecting the plurality of second display devices with the plurality of second subpixel circuits, and the plurality of second subpixel circuits are placed between the first display area and the second display area or in the non-display area.

7. The display panel of claim 6, wherein the plurality of connection wires include a first connection wire and a second connection wire on the first connection wire.

8. The display panel of claim 7, wherein the at least one transparent conductive material layer includes a same material as the first connection wire.

9. The display panel of claim 7, wherein the at least one transparent conductive material layer includes a first transparent conductive material layer and a second transparent conductive material layer on the first transparent conductive material layer.

10. The display panel of claim 9, wherein the first transparent conductive material layer includes a same material as the first connection wire, and the second transparent conductive material layer includes a same material as the second connection wire.

11. The display panel of claim 1, wherein the at least one transparent conductive material layer sequentially covers a top surface of the third conductive layer, a side surface corresponding to the edge of the third conductive layer, and a top surface of the first inorganic insulating layer under the third conductive layer.

12. The display panel of claim 11, wherein the at least one transparent conductive material layer is in direct contact with the top surface of the third conductive layer, the side surface corresponding to the edge of the third conductive layer, and the top surface of the first inorganic insulating layer under the third conductive layer.

13. The display panel of claim 1, further comprising a display device in the display area, a thin film transistor between the substrate and the display device, and a connection electrode electrically connecting the display device with the thin film transistor, wherein the thin film transistor includes a semiconductor layer, a gate electrode at least partially overlapping with the semiconductor layer, and an electrode layer arranged on the gate electrode and electrically connected with the semiconductor layer, and the third conductive layer includes a same material as the connection electrode.

14. The display panel of claim 13, wherein the first conductive layer includes a same material as the gate electrode, and the second conductive layer includes a same material as the electrode layer.

15. An electronic device comprising:

a display panel including a display area including a first display area and a second display area at least partially surrounded by the first display area, a non-display area outside the display area, and a pad area in the non-display area; and a component under the display panel corresponding to the second display area, wherein the display panel comprises:

a substrate;

a display portion arranged in the display area and including a subpixel; and a pad portion arranged in the pad area and including a pad, the pad comprises:

a first conductive layer on the substrate;

a first inorganic insulating layer covering the first conductive layer and including a first contact hole exposing at least a part of the first conductive layer;

a second conductive layer on the first inorganic insulating layer and in contact with the first conductive layer through the first contact hole; and a third conductive layer covering the second conductive layer, an edge of the third conductive layer is covered with at least one transparent conductive material layer, and the at least one transparent conductive material layer contacts the first inorganic insulating layer, wherein, in a direction parallel to a plane of a top surface of the substrate, the third conductive layer is between the second conductive layer and the at least one transparent conductive material layer.

16. The electronic device of claim 15, further comprising:

a second inorganic insulating layer covering the at least one transparent conductive material layer and including a second contact hole exposing at least a part of the third conductive layer; and a fourth conductive layer on the second inorganic insulating layer and in contact with the third conductive layer through the second contact hole.

17. The electronic device of claim 16, wherein the display panel further comprises:

a thin film encapsulation layer arranged on the display portion and including at least one organic encapsulation layer and at least one inorganic encapsulation layer; and a touch sensor layer on the thin film encapsulation layer, the touch sensor layer comprises:

a first touch insulating layer;

a first touch electrode layer on the first touch insulating layer;

a second touch insulating layer on the first touch electrode layer; and a second touch electrode layer on the second touch insulating layer, and the fourth conductive layer includes a same material as the second touch electrode layer.

18. The electronic device of claim 15, wherein the display panel comprises:

a plurality of first display devices in the first display area;

a plurality of second display devices in the second display area; and a plurality of connection wires respectively connecting a plurality of second subpixel circuits to the plurality of second display devices, and the plurality of second subpixel circuits are placed between the first display area and the second display area or in the non-display area.

19. The electronic device of claim 18, wherein the plurality of connection wires include a first connection wire and a second connection wire on the first connection wire.

20. The electronic device of claim 19, wherein the at least one transparent conductive material layer includes a same material as the first connection wire.

21. The electronic device of claim 19, wherein the at least one transparent conductive material layer includes a first transparent conductive material layer and a second transparent conductive material layer on the first transparent conductive material layer.

22. The electronic device of claim 21, wherein the first transparent conductive material layer includes a same material as the first connection wire, and the second transparent conductive material layer includes a same material as the second connection wire.

23. The electronic device of claim 15, wherein the display panel further comprises a display device in the display area, a thin film transistor between the substrate and the display device, and a connection electrode electrically connecting the display device with the thin film transistor, the thin film transistor includes a semiconductor layer, a gate electrode at least partially overlapping with the semiconductor layer, and an electrode layer arranged on the gate electrode and electrically connected with the semiconductor layer, and the third conductive layer includes a same material as the connection electrode.

* * * * *